(12) United States Patent
Meagher

(10) Patent No.: US 10,962,999 B2
(45) Date of Patent: Mar. 30, 2021

(54) MICROGRID MODEL BASED AUTOMATED REAL TIME SIMULATION FOR MARKET BASED ELECTRIC POWER SYSTEM OPTIMIZATION

(71) Applicant: WaveTech Global Inc., Hoboken, NJ (US)

(72) Inventor: Kevin Meagher, Raleigh, NC (US)

(73) Assignee: Wavetech Global Inc., Hoboken, NJ (US)

(*) Notice: Subject to any disclaimer, the term of this patent is extended or adjusted under 35 U.S.C. 154(b) by 0 days.

(21) Appl. No.: 15/925,245

(22) Filed: Mar. 19, 2018

(65) Prior Publication Data
US 2018/0210479 A1     Jul. 26, 2018

Related U.S. Application Data

(63) Continuation of application No. 14/617,271, filed on Feb. 9, 2015, now abandoned, which is a continuation
(Continued)

(51) Int. Cl.
G05F 1/66 (2006.01)
H02J 3/38 (2006.01)
(Continued)

(52) U.S. Cl.
CPC ............... *G05F 1/66* (2013.01); *G05B 17/02* (2013.01); *G06F 30/20* (2020.01); *H02J 3/38* (2013.01);
(Continued)

(58) Field of Classification Search
CPC ....................................................... G05F 1/66
See application file for complete search history.

(56) References Cited

U.S. PATENT DOCUMENTS 548,463 A   10/1895 Schaake
2,309,934 A   2/1943 Clay
(Continued)

FOREIGN PATENT DOCUMENTS

EP   0534446 A2   3/1993
EP   0845722 A2   6/1998
(Continued)

OTHER PUBLICATIONS

Xia et al. "The MicroGrid: Using Online Simulation to Predict Application Performance in Diverse Grid Network Environments," IEEE Computer society, Proceedings of the Second International Workshop on Challenges of Large Applications in Distributed Environments, Jun. 7, 2004, 10 pages.
(Continued)

*Primary Examiner* — Tejal Gami
(74) *Attorney, Agent, or Firm* — McCarter & English, LLP

(57) ABSTRACT

Systems and methods for optimizing energy consumption in multi-energy sources sites are provided. These techniques include developing a real-time model and a virtual model of the electrical system of a multi-energy source site, such as a microgrid. The real-time model represents a current state of the electrical system can be developed by collecting data from sensors interfaced with the various components of the electrical system. The virtual model of the electrical system mirrors the real-time model of the electrical system and can be used to generate predictions regarding the performance, availability, and reliability of cost and reliability of various distributed energy sources and to predict the price of acquiring energy from these sources. The virtual model can be used to test "what if" scenarios, such as routine maintenance, system changes, and unplanned events that impact the utilization and capacity of the microgrid.

20 Claims, 12 Drawing Sheets

Related U.S. Application Data of application No. 12/895,597, filed on Sep. 30, 2010, now abandoned.

(60) Provisional application No. 61/247,915, filed on Oct. 1, 2009.

(51) Int. Cl.
  *G06F 30/20* (2020.01)
  *G05B 17/02* (2006.01)
  *H02J 3/00* (2006.01)
  *H02J 3/04* (2006.01)

(52) U.S. Cl.
  CPC ............... *H02J 3/008* (2013.01); *H02J 3/04* (2013.01); *H02J 2203/20* (2020.01); *Y02E 40/70* (2013.01); *Y02E 60/00* (2013.01); *Y04S 10/50* (2013.01); *Y04S 40/20* (2013.01); *Y04S 50/10* (2013.01)

(56) References Cited

U.S. PATENT DOCUMENTS

| | | |
|---|---|---|
| 3,789,201 A | 1/1974 | Carpenter et al. |
| 4,390,841 A | 6/1983 | Martin et al. |
| 4,419,619 A | 12/1983 | Jindrick et al. |
| 4,972,290 A | 11/1990 | Sun et al. |
| 5,177,695 A | 1/1993 | Sung et al. |
| 5,251,268 A | 10/1993 | Colley et al. |
| 5,396,416 A | 3/1995 | Berkowitz et al. |
| 5,483,463 A | 1/1996 | Qin et al. |
| 5,502,339 A | 3/1996 | Hartig |
| 5,519,622 A | 5/1996 | Chasek |
| 5,539,638 A | 7/1996 | Keeler et al. |
| 5,576,700 A | 11/1996 | Davis et al. |
| 5,578,931 A | 11/1996 | Russell et al. |
| 5,598,076 A | 1/1997 | Neubauer et al. |
| 5,682,317 A | 10/1997 | Keeler et al. |
| 5,687,139 A | 11/1997 | Budney |
| 5,708,414 A | 1/1998 | Peltier et al. |
| 5,761,083 A | 6/1998 | Brown, Jr. et al. |
| 5,796,628 A | 8/1998 | Chiang et al. |
| 5,821,866 A | 10/1998 | Bemal et al. |
| 5,963,457 A | 10/1999 | Kanoi et al. |
| 6,002,260 A | 12/1999 | Lau et al. |
| 6,008,971 A | 12/1999 | Duba et al. |
| 6,029,092 A | 2/2000 | Stein |
| 6,128,540 A | 10/2000 | Van Der Vegt et al. |
| 6,178,362 B1 | 1/2001 | Woolard et al. |
| 6,272,449 B1 | 8/2001 | Passera |
| 6,311,144 B1 | 10/2001 | Abu El Ata |
| 6,313,752 B1 | 11/2001 | Corrigan et al. |
| 6,314,194 B1 | 11/2001 | Michael et al. |
| 6,321,187 B1 | 11/2001 | Squier et al. |
| 6,332,961 B1 | 12/2001 | Johnson et al. |
| 6,343,617 B1 | 2/2002 | Tinsley et al. |
| 6,408,953 B1 | 6/2002 | Goldman et al. |
| 6,492,801 B1 | 12/2002 | Sims et al. |
| 6,496,342 B1 | 12/2002 | Horvath et al. |
| 6,496,757 B1 | 12/2002 | Flueck et al. |
| 6,530,065 B1 | 3/2003 | McDonald et al. |
| 6,549,867 B1 | 4/2003 | Smith |
| 6,549,944 B1 | 4/2003 | Weinberg et al. |
| 6,553,418 B1 | 4/2003 | Collins et al. |
| 6,597,999 B1 | 7/2003 | Sinha et al. |
| 6,633,474 B1 | 10/2003 | Boudaud |
| 6,636,977 B1 | 10/2003 | Chen |
| 6,654,216 B2 | 11/2003 | Horvath et al. |
| 6,681,154 B2 | 1/2004 | Nierlich et al. |
| 6,691,065 B2 | 2/2004 | Hayashi et al. |
| 6,721,154 B2 | 4/2004 | Papallo, Jr. et al. |
| 6,733,384 B2 | 5/2004 | Lantz |
| 6,751,655 B1 | 6/2004 | Deutsch et al. |
| 6,785,592 B1 | 8/2004 | Smith et al. |
| 6,806,446 B1 | 10/2004 | Neale |
| 6,807,494 B2 | 10/2004 | Schutzbach et al. |
| 6,816,810 B2 | 11/2004 | Henry et al. |
| 6,868,311 B2 | 3/2005 | Chiang et al. |
| 6,892,361 B2 | 5/2005 | Kandogan |
| 6,963,475 B2 | 11/2005 | Klippel et al. |
| 6,999,291 B2 | 2/2006 | Andarawis et al. |
| 7,010,363 B2 | 3/2006 | Donnelly et al. |
| 7,021,974 B2 | 4/2006 | Sichner et al. |
| 7,024,649 B2 | 4/2006 | Collmeyer et al. |
| 7,031,895 B1 | 4/2006 | Takahashi et al. |
| 7,039,532 B2 | 5/2006 | Hunter |
| 7,043,340 B2 | 5/2006 | Papallo et al. |
| 7,043,411 B1 | 5/2006 | Ronaldson et al. |
| 7,081,823 B2 | 7/2006 | Gluhovsky et al. |
| 7,092,922 B2 | 8/2006 | Meng et al. |
| 7,127,327 B1 | 10/2006 | O'Donnell et al. |
| 7,135,956 B2 | 11/2006 | Bartone et al. |
| 7,136,725 B1 | 11/2006 | Paciorek et al. |
| 7,143,021 B1 | 11/2006 | McGaughy et al. |
| 7,151,329 B2 | 12/2006 | Andarawis et al. |
| 7,172,132 B2 | 2/2007 | Proffitt et al. |
| 7,200,502 B2 | 4/2007 | Gasperi et al. |
| 7,233,843 B2 | 6/2007 | Budhraja et al. |
| 7,310,590 B1 | 12/2007 | Bansal |
| 7,353,475 B2 | 4/2008 | White et al. |
| 7,359,453 B1 | 4/2008 | Hietala et al. |
| 7,373,283 B2 | 5/2008 | Herzog et al. |
| 7,398,168 B2 | 7/2008 | Lapinski et al. |
| 7,415,368 B2 | 8/2008 | Gilbert et al. |
| 7,444,310 B2 | 10/2008 | Meng et al. |
| 7,489,990 B2 | 2/2009 | Fehr et al. |
| 7,528,503 B2 | 5/2009 | Rognli et al. |
| 7,561,976 B2 | 7/2009 | Bernard et al. |
| 7,571,028 B2 | 8/2009 | Lapinski et al. |
| 7,689,323 B2 | 3/2010 | Mansingh et al. |
| 7,693,608 B2 | 4/2010 | Nasle |
| 7,729,808 B2 | 6/2010 | Nasle et al. |
| 7,739,096 B2 | 6/2010 | Wegerich et al. |
| 7,739,138 B2 | 6/2010 | Chauhan et al. |
| 7,826,990 B2 | 11/2010 | Nasle et al. |
| 7,840,395 B2 | 11/2010 | Nasle et al. |
| 7,840,396 B2 | 11/2010 | Radibratovic et al. |
| 7,844,439 B2 | 11/2010 | Nasle et al. |
| 7,844,440 B2 | 11/2010 | Nasle et al. |
| 8,036,872 B2 | 10/2011 | Nasle |
| 8,068,938 B2 | 11/2011 | Fujita |
| 8,126,685 B2 | 2/2012 | Nasle |
| 8,131,401 B2 | 3/2012 | Nasle |
| 8,155,908 B2 | 4/2012 | Nasle et al. |
| 8,155,943 B2 | 4/2012 | Nasle |
| 8,165,723 B2 | 4/2012 | Nasle |
| 8,170,856 B2 | 5/2012 | Nasle |
| 8,180,622 B2 | 5/2012 | Nasle |
| 8,229,722 B2 | 7/2012 | Nasle |
| 8,239,170 B2 | 8/2012 | Wegerich |
| 8,321,194 B2 | 11/2012 | Meagher et al. |
| 8,401,709 B2 | 3/2013 | Cherian et al. |
| 8,417,391 B1 | 4/2013 | Rombouts et al. |
| 8,494,830 B2 | 7/2013 | Radibratovic et al. |
| 8,577,661 B2 | 11/2013 | Nasle |
| 8,688,429 B2 | 4/2014 | Nasle et al. |
| 8,775,934 B2 | 7/2014 | Nasle et al. |
| 8,868,398 B2 | 10/2014 | Radibratovic et al. |
| 8,959,006 B2 | 2/2015 | Nasle |
| 9,031,824 B2 | 5/2015 | Nasle |
| 9,092,593 B2 | 7/2015 | Nasle |
| 9,111,057 B2 | 8/2015 | Radibratovic et al. |
| 9,218,035 B2 | 12/2015 | Li et al. |
| 9,367,052 B2 | 6/2016 | Steven et al. |
| 9,557,723 B2 | 1/2017 | Nasle |
| 9,634,522 B2 | 4/2017 | Bates et al. |
| 9,672,576 B2 | 6/2017 | Bhageria et al. |
| 9,846,752 B2 | 12/2017 | Nasle |
| 9,846,839 B2 | 12/2017 | Nasle et al. |
| 9,886,535 B2 | 2/2018 | Radibratovic et al. |
| 10,127,568 B2 | 11/2018 | Forbes et al. |
| 2001/0036414 A1 | 11/2001 | Makino et al. |
| 2001/0036541 A1 | 11/2001 | Makino et al. |
| 2001/0043450 A1 | 11/2001 | Seale et al. |

(56) References Cited

U.S. PATENT DOCUMENTS

| | | |
|---|---|---|
| 2001/0052766 A1 | 12/2001 | Drescher et al. |
| 2002/0035015 A1 | 3/2002 | Eich et al. |
| 2002/0138176 A1 | 9/2002 | Davis et al. |
| 2002/0193978 A1 | 12/2002 | Soudier |
| 2002/0198629 A1 | 12/2002 | Ellis |
| 2003/0004660 A1 | 1/2003 | Hunter |
| 2003/0040897 A1 | 2/2003 | Murphy et al. |
| 2003/0065486 A1 | 4/2003 | Sumida et al. |
| 2003/0083756 A1 | 5/2003 | Hsiung et al. |
| 2003/0085621 A1 | 5/2003 | Potega |
| 2003/0088511 A1 | 5/2003 | Karboulonis et al. |
| 2003/0093390 A1 | 5/2003 | Onoda et al. |
| 2003/0165137 A1 | 9/2003 | Soloway et al. |
| 2003/0174070 A1 | 9/2003 | Garrod et al. |
| 2003/0193405 A1 | 10/2003 | Hunt et al. |
| 2003/0200010 A1 | 10/2003 | Chiang et al. |
| 2003/0200075 A1 | 10/2003 | Meng et al. |
| 2003/0205938 A1 | 11/2003 | Andarawis et al. |
| 2003/0234218 A1 | 12/2003 | Yang |
| 2004/0005020 A1 | 1/2004 | Dent |
| 2004/0012901 A1 | 1/2004 | Kojovic et al. |
| 2004/0044442 A1 | 3/2004 | Bayoumi et al. |
| 2004/0061380 A1 | 4/2004 | Hann et al. |
| 2004/0073415 A1 | 4/2004 | Farhat |
| 2004/0074453 A1 | 4/2004 | Roelle et al. |
| 2004/0095237 A1 | 5/2004 | Chen et al. |
| 2004/0119434 A1 | 6/2004 | Dadd |
| 2004/0123600 A1 | 7/2004 | Brunell et al. |
| 2004/0148940 A1 | 8/2004 | Venkateswaran et al. |
| 2004/0158417 A1 | 8/2004 | Bonet |
| 2004/0176991 A1 | 9/2004 | McKennan et al. |
| 2004/0181369 A1 | 9/2004 | Hayashi et al. |
| 2004/0225648 A1 | 11/2004 | Ransom et al. |
| 2004/0236188 A1 | 11/2004 | Hutchinson et al. |
| 2004/0236547 A1 | 11/2004 | Rappaport et al. |
| 2004/0249775 A1 | 12/2004 | Chen |
| 2004/0260430 A1 | 12/2004 | Mansingh et al. |
| 2004/0260489 A1 | 12/2004 | Mansingh et al. |
| 2005/0007249 A1 | 1/2005 | Eryurek et al. |
| 2005/0012396 A1 | 1/2005 | Chidambaram et al. |
| 2005/0023996 A1 | 2/2005 | Adamson et al. |
| 2005/0033481 A1 | 2/2005 | Budhraja et al. |
| 2005/0033709 A1 | 2/2005 | Meng et al. |
| 2005/0043922 A1 | 2/2005 | Weldl et al. |
| 2005/0057265 A1 | 3/2005 | Harley et al. |
| 2005/0116814 A1 | 6/2005 | Rodgers et al. |
| 2005/0134440 A1 | 6/2005 | Breed |
| 2005/0143966 A1 | 6/2005 | McGaughy |
| 2005/0149312 A1 | 7/2005 | McGaughy |
| 2005/0156715 A1 | 7/2005 | Zou et al. |
| 2005/0197812 A1 | 9/2005 | Koleno et al. |
| 2005/0210337 A1 | 9/2005 | Chester et al. |
| 2005/0216243 A1 | 9/2005 | Graham et al. |
| 2005/0236449 A1 | 10/2005 | Bird et al. |
| 2005/0240586 A1 | 10/2005 | Sakata |
| 2005/0251296 A1 | 11/2005 | Nelson et al. |
| 2005/0264563 A1 | 12/2005 | Macura et al. |
| 2005/0281456 A1 | 12/2005 | Garvey |
| 2006/0034104 A1 | 2/2006 | Royak |
| 2006/0064291 A1 | 3/2006 | Pattipatti et al. |
| 2006/0074501 A1 | 4/2006 | Hartman et al. |
| 2006/0074598 A1 | 4/2006 | Emigholz et al. |
| 2006/0100837 A1 | 5/2006 | Symington et al. |
| 2006/0111816 A1 | 5/2006 | Spalink et al. |
| 2006/0126608 A1 | 6/2006 | Pereira et al. |
| 2006/0178782 A1 | 8/2006 | Pechtl et al. |
| 2006/0184255 A1 | 8/2006 | Dixon et al. |
| 2006/0184462 A1 | 8/2006 | Hawkins |
| 2006/0271312 A1 | 11/2006 | Hayes et al. |
| 2007/0005199 A1 | 1/2007 | He |
| 2007/0005311 A1 | 1/2007 | Wegerich et al. |
| 2007/0021874 A1 | 1/2007 | Rognli et al. |
| 2007/0055392 A1 | 3/2007 | D'Amato et al. |
| 2007/0059986 A1 | 3/2007 | Rockwell |
| 2007/0067678 A1 | 3/2007 | Hosek |
| 2007/0112694 A1 | 5/2007 | Metcalfe |
| 2007/0135971 A1 | 6/2007 | Andarawis et al. |
| 2007/0156363 A1 | 7/2007 | Stewart et al. |
| 2007/0174528 A1 | 7/2007 | Mantver |
| 2007/0181548 A1 | 8/2007 | Kaddani et al. |
| 2007/0192078 A1 | 8/2007 | Nasle et al. |
| 2007/0213956 A1 | 9/2007 | Nasle et al. |
| 2007/0239373 A1 | 10/2007 | Nasle |
| 2007/0265713 A1 | 11/2007 | Veillette et al. |
| 2007/0265811 A1 | 11/2007 | Chalasani et al. |
| 2007/0285079 A1 | 12/2007 | Nasle |
| 2007/0286089 A1 | 12/2007 | Nasle et al. |
| 2007/0288626 A1 | 12/2007 | Cunningham et al. |
| 2008/0004853 A1 | 1/2008 | Radibratovic et al. |
| 2008/0015816 A1 | 1/2008 | Jammu et al. |
| 2008/0040296 A1 | 2/2008 | Bridges et al. |
| 2008/0046387 A1 | 2/2008 | Gopal et al. |
| 2008/0049013 A1 | 2/2008 | Nasle |
| 2008/0077368 A1 | 3/2008 | Nasle |
| 2008/0109205 A1 | 5/2008 | Nasle |
| 2008/0120080 A1 | 5/2008 | Nasle |
| 2008/0141072 A1 | 6/2008 | Kalgren et al. |
| 2008/0167844 A1 | 7/2008 | Nasle et al. |
| 2008/0177678 A1 | 7/2008 | Di Martini et al. |
| 2008/0201108 A1 | 8/2008 | Furem et al. |
| 2008/0215302 A1 | 9/2008 | Nasle et al. |
| 2008/0238699 A1 | 10/2008 | Byrne et al. |
| 2008/0249756 A1 | 10/2008 | Chaisuparasmikul |
| 2008/0262820 A1 | 10/2008 | Nasle |
| 2008/0263469 A1 | 10/2008 | Nasle et al. |
| 2008/0289875 A1 | 11/2008 | Burge et al. |
| 2009/0018746 A1 | 1/2009 | Miller et al. |
| 2009/0062969 A1 | 3/2009 | Chandra et al. |
| 2009/0063122 A1 | 3/2009 | Nasle |
| 2009/0066287 A1 | 3/2009 | Pollack et al. |
| 2009/0076749 A1 | 3/2009 | Nasle |
| 2009/0083019 A1 | 3/2009 | Nasle |
| 2009/0099832 A1 | 4/2009 | Nasle |
| 2009/0105998 A1 | 4/2009 | Radibratovic et al. |
| 2009/0109021 A1 | 4/2009 | Paoletti et al. |
| 2009/0112049 A1 | 4/2009 | Ahmed |
| 2009/0113049 A1 | 4/2009 | Nasle et al. |
| 2009/0149972 A1 | 6/2009 | Nasle |
| 2009/0204234 A1 | 8/2009 | Sustaeta et al. |
| 2009/0319415 A1 | 12/2009 | Stoilov et al. |
| 2009/0326884 A1 | 12/2009 | Amemiya et al. |
| 2010/0023309 A1 | 1/2010 | Radibratovic et al. |
| 2010/0049494 A1 | 2/2010 | Radibratovic et al. |
| 2010/0076613 A1 | 3/2010 | Imes |
| 2010/0100250 A1 | 4/2010 | Budhraja et al. |
| 2010/0106342 A1 | 4/2010 | Ko et al. |
| 2010/0152910 A1 | 6/2010 | Taft |
| 2010/0168931 A1 | 7/2010 | Nasle |
| 2010/0179704 A1 | 7/2010 | Ozog |
| 2010/0217550 A1 | 8/2010 | Crabtree et al. |
| 2010/0250590 A1 | 9/2010 | Galvin |
| 2010/0262411 A1 | 10/2010 | Nasle et al. |
| 2010/0268396 A1 | 10/2010 | Nasle et al. |
| 2010/0292856 A1 | 11/2010 | Fujita |
| 2011/0082596 A1 | 4/2011 | Meagher et al. |
| 2011/0082597 A1 | 4/2011 | Meagher |
| 2011/0106321 A1 | 5/2011 | Cherian et al. |
| 2011/0202467 A1 | 8/2011 | Hilber et al. |
| 2011/0257956 A1 | 10/2011 | Goel et al. |
| 2012/0101639 A1 | 4/2012 | Carralero et al. |
| 2012/0143383 A1 | 6/2012 | Cooperrider et al. |
| 2012/0143385 A1 | 6/2012 | Goldsmith |
| 2012/0158205 A1 | 6/2012 | Hinman et al. |
| 2012/0166085 A1 | 6/2012 | Gevorkian |
| 2012/0191439 A1 | 7/2012 | Meagher et al. |
| 2012/0191440 A1 | 7/2012 | Meagher et al. |
| 2012/0265350 A1 | 10/2012 | Ashdown |
| 2012/0267346 A1 | 10/2012 | Kao et al. |
| 2012/0323382 A1 | 12/2012 | Kamel et al. |
| 2013/0076140 A1 | 3/2013 | Darden et al. |
| 2013/0113294 A1 | 5/2013 | Kaplan et al. |
| 2013/0131884 A1 | 5/2013 | Jain et al. |
| 2013/0166084 A1 | 6/2013 | Sedighy et al. |
| 2013/0245846 A1 | 9/2013 | Bellacicco et al. |

(56) References Cited

U.S. PATENT DOCUMENTS

| | | | |
|---|---|---|---|
| 2013/0253718 A1 | 9/2013 | Meagher et al. |
| 2013/0253898 A1 | 9/2013 | Meagher et al. |
| 2013/0311162 A1 | 11/2013 | Radibratovic et al. |
| 2014/0136178 A1 | 5/2014 | Meagher et al. |
| 2015/0012254 A1 | 1/2015 | Radibratovic et al. |
| 2015/0057821 A1 | 2/2015 | Nasle |
| 2015/0153757 A1 | 6/2015 | Meagher |
| 2015/0161298 A1 | 6/2015 | Meagher et al. |
| 2015/0178627 A1 | 6/2015 | Radibratovic et al. |
| 2015/0248510 A1 | 9/2015 | Meagher et al. |
| 2015/0248617 A1 | 9/2015 | Nasle |
| 2016/0048757 A1 | 2/2016 | Nasle et al. |
| 2016/0196375 A1 | 7/2016 | Nasle |
| 2016/0246904 A1 | 8/2016 | Meagher et al. |
| 2016/0246905 A1 | 8/2016 | Radibratovic et al. |
| 2016/0246906 A1 | 8/2016 | Radibratovic et al. |
| 2016/0246907 A1 | 8/2016 | Meagher et al. |
| 2016/0247065 A1 | 8/2016 | Nasle et al. |
| 2016/0248250 A1 | 8/2016 | Meagher et al. |
| 2017/0046458 A1 | 2/2017 | Meagher et al. |
| 2017/0118653 A1 | 4/2017 | Chen |
| 2017/0192398 A1 | 7/2017 | Nasle |
| 2017/0228479 A1 | 8/2017 | Meagher et al. |
| 2017/0228653 A1 | 8/2017 | Meagher et al. |
| 2017/0237254 A1 | 8/2017 | Meagher et al. |
| 2017/0336534 A1 | 11/2017 | Forbes et al. |
| 2018/0189662 A1 | 7/2018 | Nasle |
| 2018/0210479 A1 | 7/2018 | Meagher |
| 2018/0373824 A1 | 12/2018 | Meagher et al. |
| 2018/0373827 A1 | 12/2018 | Meagher et al. |
| 2019/0005165 A1 | 1/2019 | Meagher et al. |
| 2019/0034569 A1 | 1/2019 | Radibratovic et al. |
| 2019/0065971 A1 | 2/2019 | Radibratovic et al. |
| 2019/0171968 A1 | 6/2019 | Nasle et al. |
| 2019/0332073 A1 | 10/2019 | Nasle |

FOREIGN PATENT DOCUMENTS

| | | | |
|---|---|---|---|
| EP | 1103926 A2 | 5/2001 |
| EP | 1261096 A1 | 11/2002 |
| EP | 1321869 A2 | 6/2003 |
| EP | 1508952 A1 | 2/2005 |
| EP | 2081273 A2 | 7/2009 |
| JP | 2002259508 A | 9/2002 |
| JP | 2007024511 A | 2/2007 |
| WO | 0045326 A1 | 8/2000 |
| WO | 2004083969 A2 | 9/2004 |
| WO | 2005109122 A1 | 11/2005 |
| WO | 2006037231 A1 | 4/2006 |
| WO | 2007084784 A2 | 7/2007 |
| WO | 2008011563 A2 | 1/2008 |

OTHER PUBLICATIONS

European Search Report and Opinion received in Application No. 07812859.2, dated Jun. 14, 2010 (10 pages).
European Search Report and Opinion received in Application No. 07813158.8, dated Jun. 14, 2010 (11 pages).
European Search Report and Opinion received in Application No. 07868555.9, dated Apr. 4, 2011 (7 pages).
European Search Report and Opinion received in Application No. 08836989/, dated Sep. 14, 2012 (7 pages).
European Search Report and Opinion received in Application No. 08747798.0, dated Mar. 29, 2012 (6 pages).
European Search Report and Opinion received in Application No. 08826965.9, dated Mar. 29, 2012 (6 pages).
European Search Report and Opinion received in Application No. 08832975.0, dated Jul. 2, 2012 (10 pages).
European Search Report and Opinion received in Application No. 08837119.0, dated Jan. 27, 2012 (8 pages).
European Search Report and Opinion received in Application No. 08837888.0, dated May 14, 2014 (8 pages).
European Search Report and Opinion received in Application No. 08860852.6 dated Jun. 20, 2012 (5 pages).
European Search Report and Opinion received in Application No. 09798861.2, dated Feb. 1, 2012 (5 pages).
European Search Report and Opinion received in Application No. 09807426.3, dated Jan. 28, 2014 (5 pages).
Extended Search Report issued by the European Patent Office in related European Patent Application No. 07799422.6 dated Oct. 19, 2010 (6 pages).
International Search Report and Written Opinion for PCT/IB2008/003921 dated Nov. 25, 2009.
International Search Report and Written Opinion received in Applicationn No. PCT/US2007/072972, dated Sep. 23, 2008 (8 pages).
International Search Report and Written Opinion received in Applicationn No. PCT/US2007/073979, dated Jun. 30, 2008 (7 pages).
International Search Report and Written Opinion received in Applicationn No. PCT/US2008/062927, dated Jul. 11, 2008 (11 pages).
Office Action dated Apr. 28, 2015, issued in connection with U.S. Appl. No. 14/575,446 (39 pages).
International Search Report and Written Opinion received in Applicationn No. PCT/US2007/072344 dated Jul. 3, 2008 (7 pages).
Office Action dated Dec. 18, 2014, issued in connection with U.S. Appl. No. 12/267,346 (31 pages).
Office Action dated Aug. 25, 2014, issued in connection with U.S. Appl. No. 12/267,346 (24 pages).
Office Action dated Jan. 31, 2014, issued in connection with U.S. Appl. No. 12/267,346 (24 pages).
Office Action dated Apr. 15, 2013, issued in connection with U.S. Appl. No. 12/267,346 (22 pages).
Office Action dated Mar. 16, 2012, issued in connection with U.S. Appl. No. 12/267,346 (20 pages).
A Guide to Performing an Arc Flash Hazard Assessement Using Power Analysis Software, 2003, Easy Power LLC (15 pages).
Brock, et al., "Internet Accessible Power Monitoring & Control Systems," GE Industry Newsletter (7 pages).
Canadian Office Action received in Application No. 2,657,330, dated Feb. 20, 2015 (6 pages).
Corrected Notice of Allowance received in U.S. Appl. No. 11/734,709, dated Aug. 17, 2011 (3 pages).
ETAP, Energy Load Forecasting Software—ETAP PSMS Load Forecasting, Jun. 16, 2009, available at http://etap.com/monitoring_and_simulation/load_forecasting_htm.
Greenberg, et al., "Best Practices for Data Centers: Lessons Learned from Benchmarking 22 Data Centers" 2006 Agee Summer Study on Energy Efficiency in Buildings (12 pages).
Huang, et al., "Archiving and Management of Power Systems Data for Real-Time Performance Monitoring Platform," Consortium of Energy Reliability Technology Solutions, 1/20/20005.
Marroquin, Assessing Low-Voltage Arc Hazards, ETAP/Operation Technology, Inc., vol. 4, May 2008 (3 pages).
Marroquin, Assessing the Limitations of Arc Flash Hazard Tables, Electrical Safety Measures, Summer 2008 (3 pages).
Marroquin, Evaluating NFPA 70E Arc Flash Hazard Category Tables, Electrical Products and Solutions, Sep. 2007 (3 pages).
Merriam-Webster, Definition of a Multiplicity, 2017, Merriam-Webster, pp. 1-7.
Microgrid Media, What is a Microgrid?, 2015, Microgrid Media, pp. 1-8.
Mishra, Short Term Load Forecasting Using Neural Trained with Genetic Algorithm & Particle Swarm Optimization, First Internation Conference on Emerging Trends in Engineering and Technology, IEEE, 2008.
Notice of Allowance received in U.S. Appl. No. 11/734,707, dated May 9, 2014 (7 pages).
Notice of Allowance received in U.S. Appl. No. 11/770,190. dated Oct. 24, 2011 (8 pages).
Notice of Allowance received in U.S. Appl. No. 11/774,396. dated Jul. 16, 2020 (10 pages).
Notice of Allowance received in U.S. Appl. No. 11/777,121. dated Dec. 27, 2011 (8 pages).

(56) References Cited

OTHER PUBLICATIONS

Notice of Allowance received in U.S. Appl. No. 11/923,081. dated Jan. 17, 2012 (7 pages).
Notice of Allowance received in U.S. Appl. No. 12/116,795. dated Feb. 28, 2014 (5 pages).
Notice of Allowance received in U.S. Appl. No. 12/121,552. dated Aug. 4, 2014 (7 pages).
Notice of Allowance received in U.S. Appl. No. 12/249,698. dated Jun. 16, 2014 (10 pages).
Notice of Allowance received in U.S. Appl. No. 12/334,153. dated Dec. 22, 2011 (8 pages).
Notice of Allowance received in U.S. Appl. No. 12/690,062. dated Jul. 19, 2013 (11 pages).
Notice of Allowance received in U.S. Appl. No. 12/759,234. dated Nov. 12, 2013 (11 pages).
Notice of Allowance received in U.S. Appl. No. 13/948,317. dated Nov. 25, 2014 (14 pages).
Parvania, et al., "Demand Response Scheduling by Stochastic SCUC," IEEE Transactions on Smart Grid, vol. 1, No. 1, Jun. 2010.
International Search Report and Written Opinion received in Application No. PCT/US2009/051189, dated Mar. 2, 2010.
International Search Report and Written Opinion received in Application No. PCT/US2009/054077, dated Mar. 5, 2010.
International Search Report received and Written Opinion in Application No. PCT/US2010/051212, dated Jun. 1, 2011.
International Search Report and Written Opinion received in Application No. PCT/US2010/051213, dated May 18, 2011.
International Search Report and Wiitten Opinion received in Application No. PCT/US2012/022588, dated Aug. 22, 2012.
International Search Report and Written Opinion received in Application No. PCT/US2012/022590, dated Aug. 17, 2012.
Notice of Allowance received in U.S. Appl. No. 11/734,706, dated Jul. 19, 2010 (10 pages).
Notice of Allowance received in U.S. Appl. No. 11/771,681, dated Mar. 12, 2010 (11 pages).
Notice of Allowance received in U.S. Appl. No. 11/775,146, dated Jul. 22, 2010 (10 pages).
Optimal Technologies, Operations Review of Jun. 14, 2000 PG&E Bay Area Systems Events Using AempfastSoftware, Oct. 3, 2001 (32 pages).
PowerWorld Simulator—Available Transfer Capability (ATC), PowerWorld Corporation (2 pages).
Australian Office Action received in Application No. 2007214459, dated Apr. 11, 2011 (2 pages).
Australian Office Action received in Application No. 2007225261, dated May 27, 2011 (2 pages).
Australian Office Action received in Application No. 2007238094, dated Jun. 22, 2010 (2 pages).
Australian Office Action received in Application No. 2007264973, dated Aug. 16, 2010 (2 pages).
Australian Office Action received in Application No. 2007264998, dated Jun. 21, 2010 (2 pages).
Australian Office Action received in Application No. 2007269045, dated Sep. 14, 2010 (8 pages).
Australian Office Action received in Application No. 2007269093, dated Jul. 6, 2011 (1 page).
Australian Office Action received in Application No. 2007275224, dated Oct. 25, 2010 (2 pages).
Australian Office Action received in Application No. 2007275451, dated Sep. 24, 2010 (3 pages).
Australian Office Action received in Application No. 2007308995, dated Aug. 24, 2011 (2 pages).
Australian Office Action received in Application No. 2008251610, dated Apr. 2, 2012 (2 pages).
Australian Office Action received in Application No. 2008284225, dated Apr. 5, 2012 (2 pages).
Australian Office Action received in Application No. 2008284225, dated May 2, 2013 (2 pages).
Australian Office Action received in Application No. 2008304386, dated Jun. 22, 2012 (3 pages).
Australian Office Action received in Application No. 2008304566, dated Jun. 21, 2012 (3 pages).
Australian Office Action received in Application No. 2008304566, dated Jun. 27, 2013 (3 pages).
Australian Office Action received in Application No. 2008310701, dated Nov. 12, 2012 (5 pages).
Australian Office Action received in Application No. 2008310901, dated Jul. 25, 2012 (3 pages).
Australian Office Action received in Application No. 2008310904, dated Jul. 2, 2012 (3 pages).
Australian Office Action received in Application No. 2008338563, dated Sep. 13, 2012 (3 pages).
Australian Office Action received in Application No. 2008356120, dated Jul. 26, 2012 (3 pages).
Australian Office Action received in Application No. 2010300342, dated Oct. 24, 2014 (3 pages).
Canadian Office Action received in Application No. 2,641,657, dated Mar. 6, 2014 (3 pages).
Canadian Office Action received in Application No. 2,646,423, dated Jul. 30, 2014 (3 pages).
Canadian Office Action received in Application No. 2,648,953, dated Mar. 27, 2014 (4 pages).
Canadian Office Action received in Application No. 2,653,606, dated Jul. 7, 2014 (3 pages).
Canadian Office Action received in Application No. 2,653,613, dated Aug. 1, 2014 (2 pages).
Canadian Office Action received in Application No. 2,655,199, dated Aug. 8, 2014 (3 pages).
Canadian Office Action received in Application No. 2,655,630, dated Apr. 8, 2014 (6 pages).
Canadian Office Action received in Application No. 2,657,038, dated Jun. 11, 2014 (3 pages).
Canadian Office Action received in Application No. 2,684,665, dated Aug. 21, 2014 (3 pages).
Canadian Office Action received in Application No. 2,698,612, dated Aug. 19, 2014 (5 pages).
Canadian Office Action received in Application No. 2,701,997, dated Aug. 26, 2014 (2 pages).
European Search Report and Opinion received in Application No. 07752865.1, dated Jan. 29, 2010 (7 pages).
European Search Report and Opinion received in Application No. 07757001.8, dated May 16, 2011 (12 pages).
European Search Report and Opinion received in Application No. 07760596.2, dated Feb. 10, 2011 (6 pages).
European Search Report and Opinion received in Application No. 07799121.4, dated Jun. 7, 2010 (9 pages).
European Search Report and Opinion received in Application No. 07799194.1, dated Feb. 14, 2011 (8 pages).
European Search Report and Opinion received in Application No. 07812685.1, dated Feb. 15, 2011 (6 pages).
Office Action received in U.S. Appl. No. 15/089,922, dated Feb. 27, 2017 (14 pages).
Notice of Allowance received in U.S. Appl. No. 15/089,922, dated Sep. 28, 2017 (10 pages).
"Arc Flash Motor Contribution," Oct. 18, 2007, http://www.eng-tips.com/viewthread.cfm?qid=192141 (7 pages).
Notice of Allowance received in U.S. Appl. No. 13/948,317, dated Jun. 18, 2015 (12 pages).
Office Action received in U.S. Appl. No. 13/948,317, dated Jan. 21, 2014 (10 pages).
Office Action received in U.S. Appl. No. 13/358,371, dated Sep. 11, 2014 (28 pages).
Office Action received in U.S. Appl. No. 13/358,371, dated Feb. 20, 2014 (24 pages).
Examiner-Initiated Interview Summary received in U.S. Appl. No. 14/617,333, dated Oct. 12, 2016 (1 page).
Office Action received in U.S. Appl. No. 14/617,333, dated Jan. 19, 2016 (19 pages).
Office Action received in U.S. Appl. No. 14/617,333, dated Jun. 15, 2016 (17 pages).
Office Action received in U.S. Appl. No. 14/617,333, dated Jun. 12, 2017 (15 pages).

(56) References Cited

OTHER PUBLICATIONS

Office Action received in U.S. Appl. No. 14/617,333, dated Jan. 11, 2018 (18 pages).
Office Action received in U.S. Appl. No. 12/895,597, dated Nov. 25, 2014 (25 pages).
Office Action received in U.S. Appl. No. 12/895,597, dated Jun. 3, 2014 (25 pages).
Office Action received in U.S. Appl. No. 12/895,597, dated Dec. 19, 2013 (16 pages).
Office Action received in U.S. Appl. No. 12/895,597, dated May 17, 2013 (17 pages).
Office Action received in U.S. Appl. No. 12/895,597, dated Aug. 17, 2012 (17 pages).
Office Action received in U.S. Appl. No. 14/617,271, dated Sep. 21, 2017 (14 pages).
Office Action received in U.S. Appl. No. 13/836,984, dated Apr. 10, 2015 (13 pages).
Office Action received in U.S. Appl. No. 14/081,487, dated Mar. 20, 2015 (9 pages).
Office Action received in U.S. Appl. No. 15/079,607, dated Oct. 28, 2016 (16 pages).
Office Action received in U.S. Appl. No. 15/089,938, dated Oct. 26, 2016 (12 pages).
Office Action received in U.S. Appl. No. 15/497,913, dated Mar. 7, 2018 (14 pages).
Office Action received in U.S. Appl. No. 15/499,993, dated Mar. 5, 2018 (16 pages).
Office Action received in U.S. Appl. No. 15/089,966, dated Nov. 2, 2016 (16 pages).
Vokmirovic, et al., "Software Architecture for Smart Metering System with Virtual Power Plant," 2010 (4 pages).
Office Action received in U.S. Appl. No. 13/837,426, dated Mar. 25, 2015 (11 pages).
Mike Holt, "What is Arc Flash," 2004, https://www.mikeholt.com/mojonewsarchive/NEC-HTML/HTML/What-is-arc-flash-20040512.php (8 pages).
Hodder, et al., "Practical Arc-Flash Reduction," 2006, IEEE Industry Applications Magazine, May/Jun. 2006, pp. 22-29 (8 pages).
Graham, et al., "Current Methods for Conducting an Arc-Flash Hazard Analysis," 2004, Industry Applications Conference, pp. 1741-1748 (8 pages).
Tinsely, et al., "Arc Flash Hazard Calculations," Jan. 2007, IEEE Industry Application Magazine, pp. 58-64 (7 pages).
Nerdhurd," Formula for Last 30 Days of Current Date?," 2005, http://www.tek-tips.com/viewthread.cfm?qid=1063028 (2 pages).
Office Action received in U.S. Appl. No. 14/617,370, dated May 9, 2018 (51 pages).
Notice of Allowance received in U.S. Appl. No. 15/998,739, dated May 1, 2020 (8 pages).
Office Action dated Jul. 22, 2020, issued in connection with U.S. Appl. No. 16/507,779 (26 pages).
ETAP, Benefits of ETAP Intelligent Load Shedding, Operation Technology (3 pages).
Office Action dated Aug. 26, 2020, issued in connection with U.S. Appl. No. 16/117,684 (13 pages).
Notice of Allowance dated Aug. 13, 2020, issued in connection with U.S. Appl. No. 15/998,739 (8 pages).
*Power Analytics Corporation v. Operation Technology, Inc.*, et al., USDC Central District of California Case No. SA CV16-01955 JAK (FFMx), Order Re Defendants' Motion for Partial Summary Judgment as to Invalidity, Jul. 13, 2017 (8 pages).
Notice of Allowance dated Jan. 22, 2020, issued in connection with U.S. Appl. No. 15/998,739 (8 pages).
Mills-Price, et al., "Solar Generation Control with Time-Synchronized Phasors," 2011 (10 pages).
Arima, et al. "A Self-Learning Neural Network chip with 125 Neurons and 10K Self-Organization Synapses." IEEE Journal of Solid-State Circuits 26.4 (1991): 607-611 (5 page).
Chaturvedi, Devendra K., et al. "Improved Generalized Neuron Model for Short-Term Load Forecasting." Soft Computing 8.1 (2003): 10-18 (9 pages).
Office Action dated Feb. 4, 2020, issued in connection with U.S. Appl. No. 16/253,072 (9 pages).
PowerWorld Corporation, Integrated Topology Processing: a Breakthrough in Power System Software Unification ( 2 pages).
Stamp, et al., Reference Model for Control and Automation Systems in Electrical Power, Oct. 12, 2004 (17 pages).
Jung, et al., Modeling and Control of Fuel Based Distributed Generation Systems in a Standalone AC Power Supply, Journal of Iranian Association of Electrical and Electronics Engineers, vol. 2, No. 1, 2005 (14 pages).
Van Gorp, Using Key Performance Indicators to Manage Power System Reliability, Schneider Electric 2006, (8 pages).
Stacchini de Souza, et al., Alarm processing in Electrical Power Systems Through a Neuro-Fuzzy Approach, IEEE Transactions on Power Delivery, vol. 19, No. 2, Apr. 2004 (8 pages).
Kezunovic., "Monitoring of Power System Topology in Real-Time," Symposium on Electric Power Systems Reliability, Hawaii International Conference on system Sciences, IEEE, Jan. 2006.
Nor, et al., Digital Dimulation of Uninterruptible Power supply (UPS) and Dynamic Voltage Restorer (DVR) for Voltage SAG Mitigation (6 pages).
Klump et al., An Advanced Visualization Platform for Real-Time Power System Operations, 8 pages.
Klump et al., Visualizing Real-Time Security Threats Using Hybrid SCADA / PMU Measurement Displays,38th Hawaii International Conference on System Sciences, 2005, IEEE, 9 pages.
Tolbert, et al., Survey of Harmonics Measurements in Electrical Distribution Systems, IEEE IAS Annual meeting, Oct. 6-10, 1996, San Dieto, CA (7 pages).
Manoj, et al., Real-Time Monitoring & Analysis of Harmonics in Single-Phase Systems, Nationalinstruments, (6 page).
Merrell, "The Importance of the X/R Ratio in Low-Voltage Short Circuit Studies." Nov. 17, 1999, [retrieved Oct. 27, 2007] Retrieved from the internet, URL: http://www.powerstudies.com/articles/importanceofX-over-RRatios.pdf.
Office of Health Safety and Security, "Wearing Arc Flash Clothing Can Save Your Life", Operating Experience Summary, Issue No. 2006-14, Article 1, Dec. 8, 2006.
Order Denying Request for Inter Partes Reexamination received in U.S. Appl. No. 95/001,611, mailed Jul. 25, 2011, 30 pages.
Pasternak et al., Adaptable Drawing Interpretation Using Object-Oriented and Constraint-Based Graphic Specification, 6 pages.
PowerWorld Corporation Products, Power World Topology Processing, http://www.powerworld.com/products/retrieverTP.asp.
PowerWorid Corporation, PowerWorld Simulator User's Guide, Version 7.0, Oct. 2000 (401 pages).
Ranade et al. "An Overview of Harmonics Modeling and Simulation", 1998.
Tnani, et al., Comparison between difference real-time harmonic analysis methods for control of electrical machines, IEEE Xplore (1 page).
Cease, et al., Real-Time Monitoring of the TVA Power System, 8310 IEEE Computer applications in Power 7 (1994) Jul., No. 3, New York, US (5 pages).
Abdallah, et al., Control Dynamics of Adaptive and Scalable Power and Energy Systems for Military MicroGrids, US Army Corps of Engineers, Dec. 2006 (55 pages).
Laffey, et al., Real-Time Knowledge-Based Systems, AI Magazine, vol. 9, No. 1, 1988 (19 pages).
Zhu, et al., A Model-in-the-Loop Interface to Emulate Source Dynamics in a Zonal DC Distribution System, IEEE Transactions on Power Electronics, vol. 20, No. 2, Mar. 2005 (8 pages).
Lee, et al., Development of a Real Time Power System Dynamic Performance Monitoring System, IEEE 1996 (6 pages).
Western Power Selects Transpara's Visual KPI for Enterprise-Wide Deployment, Transpara, Nov. 27, 2007 (2 pages).
Klump, et al. "Visualizing Real-Time Security Threats Using Hybrid SCADA/PMU Measurement Displays", Proceedings of the 38th Hawaii International Conference on System Sciences—IEEE 2005.

(56) References Cited

OTHER PUBLICATIONS

Bowman, Welcome to Electrical Safety Presentation, Alliance (60 pages).
Mihailovic, et al., Modeling and Control Design of VSI-Fed PMSM Drive Systems with Active Load (1 page).
"A System View of the Modem Grid—Advanced Control Methods," Conducted by the National Energy Technology Laboratory for the U.S. Department of Energy, Mar. 2007.
Kwasinski, et al., "Optimal Configuration Analysis of a Microgrid-Based Telecom Power System," copyright 2006 IEEE.
3D Modeling and Visualization, Pinnacle Infotech Inc., Feb. 5, 2005 (1 page).
Akhrarov, et al., A Novel Approach to Predictive Condition Monitoring and Knowledge Management in Power Systems (9 pages).
Marroquin, Evaluating the Hazards of Low-Voltage Arcs, Electrical Products & Solutions, Jun. 2007 (4 pages).
Yao, et al., Development a PC-Based Automated Monitoring and Control Platform for Electric Power Systems, Electric Power Systems Research 64, 2003 (8 pages).
Papalexopoulos, et al., An Implementation of a Neural Network Based Load Forecasting Model for the EMS, IEEE Transactions on Power Systems, vol. 9, No. 4, Nov. 1994 (7 pages).
Bose, et al., Automated Operating Procedures for Transfer Limits, PSERC Publication 01-05, May 2001 (54 pages).
Arcad, Arc Flash Studies, IEEE 1584 Based Arc Flash Calculator.
Arc-Resistant Motor Control Equipment Increases Safety and Reduces PPE Requirements, Rockwell Automation (4 pages).
Avila-Rosales et al., Wide-Area Monitoring and Control for Power System Grid Security, 15th PSCC, Liege, Aug. 22-26, 2005 (7 pages).
Azbe V et al: "Computer-aided coordination of power system protection", Computer as a Tool: The IEEE Region 8 EUROCON 2003; Sep. 22-24, 2003, Faculty of Electrical Engineering, University of Ljubljana, Ljubljana, Slovenia; Proceedings, IEEE Service Center, Piscataway, NJ, USA, vol. 2, Sep. 22, 2003, pp. 268-272, XP01 0671508.
Qiu, et al., Web-Based SCADA Display Systems (WSDS) for Access via Internet, IEEE Transactions on Power Systems, vol. 5, No. 2, May 2000 (6 pages).
Wollenberg, "A Brief Review of Electric Power Energy Management Systems," http://www.blackout.com/gmu.edu/archive/pdf/EnergyManagementSystems.pdf.
Bizjak, et al., Increasing Power Quality in Systems with Limited Power Sources, 47th International Symposium ELMAR-2005, Jun. 8-10, 2005, Zadar, Croatia (4 pages).
Carati, A Robust High Performance Three-Phase Uninterruptible Power Supply. Proceedings of the 2000 IEEE International Conference on Control Applications. Sep. 25-27, 2000.
Inshaw, et al., Arc Flash Hazard Analysis and Mitigation, Western Protective Relay Conference, Spokane, WA, Oct. 20, 2004 (20 pages).
Popovic, et al., A Unified Application Software for Steady-State Security and Automatic Cross-Border Transmission capacity Assessments, IEEE Xplore (1 page).
Dvorak, et al., Process monitoring and diagnosis: a model-based apporach, IEEE Expert 6{e): 67-74, Jun. 1991 (24 pages).
Dash et al., A new approach to monitoring electric power quality (10 pages).
Koval, et al, Evaluation the Reliability Cost of Computer System Interruptions due to Power System Disturbances, IEEE Transactions on Industry Applications, vol. 25, No. 2, Mar./Apr. 1989 (9 pages).
Ebata, et al. "Development of the Intranet-Based SCADA (Supervisory Control and Data Acquisition System) for Power System", IEEE 2001.
Mensah, et al., Models for Optimal Dynamic Reconfiguration and Simulation of Ship Power Systems in Simulink with Stateflow, IEEE 2007 (6 pages).
EDSA Professional Power System Design and Simulation for CATIA V5, EDSA Micro Corporation, San Diego, CA, Jun. 24, 2004 (8 pages).

Engineering Specifications, Sensaphone 1400 (4 pages).
Entellisys Low-Voltage Switchgear, GE Consumer & Industrial Electrical Distribution, 2005 (17 pages).
ETAP, What is the comparison of NFPA 70E-2000 an IEEE 1584-2002 standards for Arc Flash Analysis?, ETAP FAQ #15, Jun. 11, 2003 (7 pages).
Eto et al., Grid Reliability Management Tools, IEEE Power Engineering Society Winter Meeting, Jan. 28-31, 2001 (5 pages).
Shokooh, et al., "Real-Time Simulation and Supervisory Control; The Next Logical Step after System Monitoring," PCIC-96-32 (1996).
Fidalgo, et al. "Load Forecasting Performance Enhancement When Facing Anomalous Events", Feb. 2005, IEEE Trans on Power Systems, vol. 20, No.1, pp. 408-415.
Giannuzzi, et al., Advanced Load-Shedding Methodology and Architecture for Normal and Emergency Operatio of the Italian Power System, IEEE 2005 (7 pages).
Gammon, et al., "Incident Energy Factors and Simple 480-V Incident Energy Equations." IEEE 1584-2002, IEEE Industry Applications Magazine, vol. 11, pp. 23-31, Feb. 17, 2004.
Geidl!, Protection of Power Systems with Distributed Generation: State of the Art, Swiss Federal Institute of Technology (ETH) Zurich, Jul. 20, 2005 (35 pages).
Gross, et al., Consortium for Reliability Technology Solutions Grid of the Future White Paper on Real Time Security Monitoring and Control of Power Systems, Dec. 1999 (48 pages.).
Google, Google Guide making searching even easier, 5 pages, <http://www.googleguide.com/google_works.html>.
Google, Search results options and tools (4 pages).
Hague et al., Application of Neural Networks in Power Systems; A Review, World Academy of Science, Engineering and Technology Jun. 2005 (5 pages).
Huening, "Calculating Short-Circuit Currents with Contributions from Induction Motors," Apr. 1982, IEEE Transactions on industry applications, vol. IA-18, No. 2, pp. 85-92.
Office Action dated Jul. 24, 2018, issued in connection with U.S. Appl. No. 15/090,657 (45 pages).
International Search Report and Written Opinion related to PCT/US07/62153 dated Feb. 12, 2008.
International Search Report and Written Opinion for PCT/US07/66567 dated Apr. 2, 2008.
International Search Report and Written Opinion for PCT/US07/72539 dated Jul. 29, 2008.
Operation Technology, Inc., ETAP Product Materials, http://www.etap.com.
Shokooh, et al., "An Intelligent Load Shedding (ILS) System Application in a Large Industrial Facility," Industry Applications Conference, Fortieth IAS Annual Meeting, vol. 1, Issue,Oct. 2-6, 2005, pp. 417-425.
Roitman, et al., "Real Time Digital Simulation: Trends on Technology and T&D Applications," Power Systems conference and Exposition, 2004, IEEE PES, Oct. 2004.
Notice of Allowance dated Jun. 10, 2011, issued in connection with U.S. Appl. No. 11/734,709 (9 pages).
Valentine, "A Perspective of Low-Voltage Circuit Breaker Interrupting Rating", Oct. 1998, IEEE.
International Search Report and Written Opinion related to PCT/US2008/079601 dated Dec. 10, 2008.
International Search Report and Written Opinion related to PCT/US07/06195 dated Feb. 22, 2008.
International Search Report and Written Opinion for PCT/US07/82361 dated Jun. 25, 2008.
International Search Report and Written Opinion received in Application No. PCT/US07/073375 dated Jul. 1, 2008.
Parikh, Modeling, Simulation and Analysis of an Uninterruptible Power Supply. Motion Controls Research Group. 1994 IEEE. pp. 485-489.
International Search Report and Written Opinion for PCT/US07/73083 dated Jul. 7, 2008.
Notice of Allowance issued by the USPTO in related U.S. Appl. No. 11/780,764 dated Jan. 13, 2010.

(56) References Cited

OTHER PUBLICATIONS

Ma, et al., "Real Time Power Distribution Network Simulation with RT-Lab," http://www.opal-rt.com/success-story/real-time-power-distributio- n-network-simulation-rt-lab.
Notice of Allowance dated Jul. 22, 2010, issued in connection with U.S. Appl. No. 11/717,378 (9 pages).
Office Action dated Jul. 7, 2009, issued in connection with U.S. Appl. No. 11/717,378 (19 pages).
Office Action dated Dec. 11, 2009, issued in connection with U.S. Appl. No. 11/717,378 (20 pages).
Notice of Allowance dated May 6, 2010, issued in connection with U.S. Appl. No. 11/674,994 (13 pages).
Office Action dated Feb. 18, 2010, issued in connection with U.S. Appl. No. 11/674,994 (12 pages).
International Search Report and Written Opinion received in Application No. PCT/US2008/063756, dated Sep. 22, 2008.
International Search Report and Written Opinion received in Application No. PCT/US2008/077355, dated Dec. 1, 2008.
International Search Report and Written Opinion received in Application No. PCT/US2008/077684, dated Dec. 12, 2008.
International Search Report and Written Opinion received in Application No. PCT/US2008/079215, dated Dec. 3, 2008.
International Search Report received in Application No. PCT/US2008/079218, dated Dec. 22, 2008 (1 page).
International Search Report and Written Opinion received in Application No. PCT/US2008/086656, dated Mar. 19, 2009.
Schwaegerl, Advanced Architectures and Control Cooncepts for More Microgrids, Dec. 2009.
Sharif, Real-Time Load Forecasting by Artificial Neural Networks, University of New Brunswick.
PowerWorld Corporation, PowerWorld Simulator—Available Transfer Capacity, 2000.
Venu, Islanded Operation of a Distribution Feeder with Distributed Generation.
Catcher13, ArcFlashForum.com, Jul. 2007, 1 page.
NFPA 70E, NPL, "Welcome to Electrical Safety Presentation," Dec. 2006.
Notice of Allowance received in U.S. Appl. No. 15/068,105, dated Jun. 21, 2017 (10 pages).
Office Action received in U.S. Appl. No. 15/068,105, dated Dec. 14, 2016 (14 pages).
Office Action received in U.S. Appl. No. 12/237,948, dated Aug. 3, 2011 (11 pages).
Office Action received in U.S. Appl. No. 12/237,948, dated Jan. 30, 2012 (10 pages).
Office Action received in U.S. Appl. No. 12/237,948, dated Jun. 13, 2013 (11 pages).
Office Action received in U.S. Appl. No. 12/237,948, dated Feb. 12, 2014 (11 pages).
Office Action received in U.S. Appl. No. 12/237,948, dated Aug. 22, 2014 (11 pages).
Notice of Allowance received in U.S. Appl. No. 12/237,948, dated Mar. 26, 2015 (7 pages).
Canadian Office Acton received in Application No. 2,684,566, dated Feb. 3, 2015 (4 pages).
Office Action received in U.S. Appl. No. 15/262,778, dated Feb. 16, 2018 (14 pages).
Office Action received in U.S. Appl. No. 14/597,499, dated Aug. 19, 2015 (11 pages).
Office Action received in U.S. Appl. No. 14/597,499, dated Apr. 25, 2016 (10 pages).
Applicant-Initiated Interview Summary received in U.S. Appl. No. 14/597,499, dated Jul. 29, 2016 (3 pages).
Office Action received in U.S. Appl. No. 13/358,376, dated Jul. 16, 2014 (11 pages).
Office Action received in U.S. Appl. No. 13/358,376, dated Dec. 23, 2013 (9 pages).
Office Action received in U.S. Appl. No. 15/418,943, dated Jan. 11, 2019 (20 pages).
Office Action received in U.S. Appl. No. 15/083,630, dated Apr. 5, 2018 (21 pages).
Office Action received in U.S. Appl. No. 14/617,313, dated Feb. 27, 2017 (21 pages).
Office Action received in U.S. Appl. No. 14/617,313, dated Sep. 1, 2017 (19 pages).
Donner, et al., "Real-Time Simulator for Industrial Electrical Power Systems," IEEE Petroleum and Chemical Industry Conference, 1992 Annual Conference Proceedings, pp. 57-60.
Hsu, et al., "Design of Adaptive Load Shedding by Artificial Neural Networks," IEEE Proc.—Gener. Transm. Distrib., vol. 152, No. 3, May 2005, pp. 415-421 (7 pages).
Notice of Allowance received in U.S. Appl. No. 15/998,739, dated Sep. 30, 2019 (9 pages).
Office Action received in U.S. Appl. No. 15/998,739, dated Aug. 7, 2019 (7 pages).
Savulescu , Real-Time Stability Assessment in Modern Power System Control Centers, Wiley-IEEE Press.
Martinez, et al, "Archiving and Mangement of Power Systems Data for Real-Time Performance Monitoring Platform,", Consortium of Electric Reliablity Technology Solutions, Jan. 20, 2005.
Notice of Allowance received in U.S. Appl. No. 12/236,030, dated Oct. 31, 2011 (8 pages).
Office Action received in U.S. Appl. No. 12/236,030, dated Jul. 18, 2011 (19 pages).
Notice of Allowance received in U.S. Appl. No. 12/121,552, dated Sep. 26, 2016 (7 pages).
Office Action received in U.S. Appl. No. 12/121,552, dated Jul. 26, 2011 (21 pages).
Office Action received in U.S. Appl. No. 12/121,552, dated Dec. 10, 2010 (20 pages).
Office Action received in U.S. Appl. No. 12/121,552, dated Apr. 11, 2014 (18 pages).
Office Action received in U.S. Appl. No. 12/121,552, dated Sep. 13, 2013 (18 pages).
Notice of Allowance received in U.S. Appl. No. 12/121,552, dated Jul. 19, 2013 (8 pages).
Office Action received in U.S. Appl. No. 12/121,552, dated Jan. 25, 2012 (20 pages).
Office Action received in U.S. Appl. No. 11/777,121, dated Jun. 28, 2011 (19 pages).
Interview Summary received in U.S. Appl. No. 11/777,121, dated Sep. 28, 2010 (3 pages).
Office Action received in U.S. Appl. No. 11/777,121, dated Aug. 5, 2010 (21 pages).
Office Action received in U.S. Appl. No. 11/777,121, dated Jan. 25, 2010 (14 pages).
Office Action received in U.S. Appl. No. 11/775,146, dated Dec. 31, 2009 (26 pages).
Notice of Allowance received in U.S. Appl. No. 12/759,061, dated Nov. 28, 2011 (10 pages).
Office Action received in U.S. Appl. No. 12/759,061, dated Oct. 19, 2011 (9 pages).
Office Action received in U.S. Appl. No. 12/759,061, dated Mar. 16, 2011 (11 pages).
Notice of Allowance received in U.S. Appl. No. 14/925,227, dated Jun. 29, 2017 (10 pages).
Office Action received in U.S. Appl. No. 14/925,227, dated Mar. 6, 2017 (20 pages).
Office Action received in U.S. Appl. No. 11/734,707, dated Jun. 21, 2011 (13 pages).
Office Action received in U.S. Appl. No. 11/734,707, dated Dec. 30, 2011 (14 pages).
Office Action received in U.S. Appl. No. 11/734,707, dated Jul. 23, 2012 (13 pages).
Office Action received in U.S. Appl. No. 11/734,707, dated Jun. 4, 2010 (13 pages).
Office Action received in U.S. Appl. No. 11/734,707, dated Dec. 23, 2010 (11 pages).
Office Action received in U.S. Appl. No. 11/734,707, dated Jun. 21, 2013 (12 pages).
Office Action received in U.S. Appl. No. 11/734,707, dated Jan. 9, 2014 (12 pages).

(56) References Cited

OTHER PUBLICATIONS

Notice of Allowance received in U.S. Appl. No. 14/532,559, dated Mar. 27, 2015 (9 pages).
Office Action received in U.S. Appl. No. 11/770,190, dated Jun. 4, 2010 (12 pages).
Office Action received in U.S. Appl. No. 11/770,190, dated Nov. 16, 2010 (13 pages).
Office Action received in U.S. Appl. No. 11/770,190, dated Jun. 10, 2011 (12 pages).
Notice of Allowance received in U.S. Appl. No. 11/770,190, dated Oct. 24, 2011 (11 pages).
Office Action received in U.S. Appl. No. 12/116,795, dated Mar. 10, 2011 (19 pages).
Office Action received in U.S. Appl. No. 12/116,795, dated Oct. 17, 2011 (20 pages).
Office Action received in U.S. Appl. No. 12/116,795, dated Apr. 10, 2013 (14 pages).
Office Action received in U.S. Appl. No. 12/116,795, dated Oct. 25, 2013 (8 pages).
Office Action received in U.S. Appl. No. 11/923,081, dated Apr. 26, 2010 (10 pages).
Office Action received in U.S. Appl. No. 11/923,081, dated Jan. 18, 2011 (12 pages).
Office Action received in U.S. Appl. No. 11/923,081, dated Aug. 29, 2011 (12 pages).
Applicant-Intitated Interview Summary received in U.S. Appl. No. 11/923,081, dated Nov. 22, 2011 (3 pages).
A. Coleman, "Development of a Multi-Bus, Multi-Source Reconfigurable Stirling Radioisotope Power System Test Bed," NASA Technical Memorandum (NASA/CR-2004-213319) (AIAA-2004-5713).
Office Action received in U.S. Appl. No. 12/247,886, dated Apr. 19, 2011 (20 pages).
Office Action received in U.S. Appl. No. 12/247,886, dated Sep. 29, 2011 (24 pages).
Notice of Allowance received in U.S. Appl. No. 12/247,886, dated Mar. 22, 2012 (9 pages).
Office Action received in U.S. Appl. No. 12/690,062, dated Nov. 28, 2011 (18 pages).
Office Action received in U.S. Appl. No. 12/690,062, dated May 25, 2012 (14 pages).
Office Action received in U.S. Appl. No. 12/690,062, dated Nov. 8, 2012 (18 pages).
Office Action received in U.S. Appl. No. 12/759,234, dated Jan. 6, 2012 (36 pages).
Office Action received in U.S. Appl. No. 12/759,234, dated May 23, 2012 (28 pages).
NERC (Reliability Consideration from the Integration of Smart Grid), Dec. 2010 (137 pages).
Office Action received in U.S. Appl. No. 16/117,684, dated Jul. 2, 2019 (10 pages).
Office Action received in U.S. Appl. No. 16/117,684, dated Jan. 16, 2020 (12 pages).
Office Action received in U.S. Appl. No. 11/774,396, dated Dec. 9, 2009 (27 pages).
Office Action received in U.S. Appl. No. 15/925,245, dated Dec. 30, 2019 (15 pages).
Office Action received in U.S. Appl. No. 16/031,461, dated Jul. 12, 2019 (20 pages).
Office Action received in U.S. Appl. No. 16/031,461, dated Apr. 16, 2020 (23 pages).
Rahimi, et al., "Demand Response as a Market Resource under the Smart Grid Paradigm," IEEE Transactions on Smart Grid, vol. 1, No. 1, Jun. 2010 (7 pages).
Office Action received in U.S. Appl. No. 15/582,814, dated Dec. 7, 2018 (15 pages).
Office Action received in U.S. Appl. No. 15/582,814, dated Sep. 20, 2019 (13 pages).
Office Action received in U.S. Appl. No. 12/334,153, dated Aug. 18, 2011 (14 pages).
Office Action received in U.S. Appl. No. 12/249,698, dated Oct. 21, 2011 (35 pages).
Office Action received in U.S. Appl. No. 12/249,698, dated Mar. 1, 2011 (30 pages).
Notice of Allowance received in U.S. Appl. No. 14/496,862, dated Jul. 6, 2015 (12 pages).
Notice of Allowance received in U.S. Appl. No. 12/247,873, dated Nov. 30, 2011 (5 pages).
Office Action received in U.S. Appl. No. 12/247,873, dated May 19, 2011 (10 pages).
Office Action received in U.S. Appl. No. 11/734,709, dated Nov. 15, 2010 (16 pages).
Office Action received in U.S. Appl. No. 11/734,709, dated Jun. 4, 2010 (15 pages).
Office Action received in U.S. Appl. No. 12/506,216, dated Jul. 9, 2012 (16 pages).
Notice of Allowance received in U.S. Appl. No. 12/506,216, dated Mar. 20, 2013 (10 pages).

MICROGRID MODEL BASED AUTOMATED REAL TIME SIMULATION FOR MARKET BASED ELECTRIC POWER SYSTEM OPTIMIZATION

CROSS-REFERENCES TO RELATED APPLICATIONS

This application relates to and claims priority from the following U.S. Patent Applications. This application is a continuation of U.S. application Ser. No. 14/617,271 filed Feb. 9, 2015, which is a continuation of U.S. application Ser. No. 12/895,597 filed Sep. 30, 2010, which claims the benefit of U.S. Provisional Application No. 61/247,915 filed Oct. 1, 2009, each of which is incorporated herein by reference in its entirety.

This application is also related to U.S. patent application Ser. No. 12/895,586, now U.S. Pat. No. 8,321,194, filed Sep. 30, 2010, which in turn claims the benefit of U.S. Provisional Application Ser. No. 61/247,917, filed Oct. 1, 2009, both of which are incorporated herein by reference in their entirety as if set forth in full.

BACKGROUND OF THE INVENTION

1. Field of the Invention

The present invention relates generally to computer modeling and management of systems and, more particularly, to computer simulation techniques with real-time system monitoring and prediction of electrical system performance.

2. Background

Electric generation has traditionally been performed by large-scale centralized facilities that are powered by fossil fuels or nuclear power or hydropower. Distributed generation is an alternative approach to centralized systems. Distributed generation systems include smaller-scale power generation facilities that can be used in addition to or instead of the traditional centralized facilities.

A microgrid is a localized grouping of electrical resources and loads that are typically connected to and synchronized with the traditional centralized electrical grid (also referred to herein as the macrogrid). A microgrid is typically connected to the macrogrid at a single point of connection, and the microgrid can typically disconnect from the macrogrid and function as an autonomous power system. The microgrid typically includes control independent of the macrogrid that allows the microgrid to be adjusted for changes in operating parameters, such as local load levels, independently of the macrogrid. Microgrids can be used as part of a distributed energy system where energy is generation is decentralized and energy is generated from many small sources. For example, a microgrid may be a smaller generation station that is designed to supply power to a single building or set of buildings, such as a hospital or office building complex. A microgrid might also be designed to power a larger area, such as a university campus or industrial complex that includes a larger number of buildings and can include greater load. Depending upon the specific implementation, the microgrid can have varying reliability requirements. For example, an implementation of a microgrid at a hospital or an industrial complex may have greater reliability requirements than a microgrid supplying power to a residential dormitories and classrooms on a university campus.

Microgrids can provide a hybrid power infrastructure where power from the conventional macrogrid is used in combination with the power generated onsite by the microgrid. Electrical power is often sold on complex market, and distributed energy systems, such as microgrids, add additional complexity to the market. Microgrids can sell excess power to the macrogrid and can purchase power from the macrogrid in order to meet local demand in excess of the generation capacity of the microgrid.

Optimization of market-based power systems is a critical component of distributed energy generation management. Demand for electricity and market conditions, such as pricing and availability of electrical power, create a complex market, and consideration must be taken for overall availability and reliability of the system. Various scenarios under consideration can impact or be impacted by external events, such as routine maintenance, system changes, or unplanned events that impact the electrical power network. Conventional approaches to market-based optimization do not take into account these potential effects on the power market.

Conventional systems provide market-based pricing of distributed energy off-line and do not consider real-time power network conditions. Conventional systems also do not provide for real-time evaluation of microgrid data to generated predicted impacts on availability and reliability of the microgrids.

Computer models of complex systems, such as microgrids, enable improved system design, development, and implementation through techniques for off-line simulation of the system operation. That is, system models can be created that computers can "operate" in a virtual environment to determine design parameters. All manner of systems can be modeled, designed, and virtually operated in this way, including machinery, factories, electrical power and distribution systems, processing plants, devices, chemical processes, biological systems, and the like. Such simulation techniques have resulted in reduced development costs and superior operation.

Design and production processes have benefited greatly from such computer simulation techniques, and such techniques are relatively well developed, but such techniques have not been applied in real-time, e.g., for real-time operational monitoring and management. In addition, predictive failure analysis techniques do not generally use real-time data that reflect actual system operation. Greater efforts at real-time operational monitoring and management would provide more accurate and timely suggestions for operational decisions, and such techniques applied to failure analysis would provide improved predictions of system problems before they occur. With such improved techniques, operational costs could be greatly reduced.

For example, mission critical electrical systems, e.g., for data centers or nuclear power facilities, must be designed to ensure that power is always available. Thus, the systems must be as failure proof as possible, and many layers of redundancy must be designed in to ensure that there is always a backup in case of a failure. It will be understood that such systems are highly complex, a complexity made even greater as a result of the required redundancy. Computer design and modeling programs allow for the design of such systems by allowing a designer to model the system and simulate its operation. Thus, the designer can ensure that the system will operate as intended before the facility is constructed.

Once the facility is constructed, however, the design is typically only referred to when there is a failure. In other words, once there is failure, the system design is used to trace the failure and take corrective action; however, because such design are complex, and there are many interdependencies, it can be extremely difficult and time consuming to track the failure and all its dependencies and then take corrective action that does not result in other system disturbances.

SUMMARY

Systems and methods for optimizing energy consumption in multi-energy sources sites are provided. Techniques are provided for developing a real-time model and a virtual model of the electrical system of a multi-energy source site, such as a microgrid. The real-time model represents a current state of the electrical system can be developed by collecting data from sensors interfaced with the various components of the electrical system. The virtual model of the electrical system mirrors the real-time model of the electrical system and can be used to generate predictions regarding the performance, availability, and reliability of cost and reliability of various distributed energy sources and to predict the price of acquiring energy from these sources. The virtual model can be used to test "what if" scenarios, such as routine maintenance, system changes, and unplanned events that impact the electrical power network. The virtual model can also be used to predict the effect of various scenarios on microgrid utilization and capacity.

According to an embodiment, a system for real-time modeling of electrical system performance of a microgrid electrical system is provided. The system includes a data acquisition component communicatively connected to a sensor configured to acquire real-time data output from the electrical system. The system also includes an analytics server communicatively connected to the data acquisition component. The analytics server comprises a virtual system modeling engine, analytics engine, and a network optimization simulation engine. The virtual system modeling engine is configured to generate predicted data output for the electrical system utilizing a first virtual system model of the electrical system. The analytics engine is configured to monitor the real-time data output and the predicted data output of the electrical system. The analytics engine is further configured to initiate a calibration and synchronization operation to update the first virtual system model when a difference between the real-time data output and the predicted data output exceeds a threshold. The network optimization simulation engine is configured to use the virtual system model updated based on the real-time data to forecast the cost of operating the microgrid electrical system and the reliability and availability of the microgrid electrical system.

According to one embodiment, a computer implemented method for real-time modeling of the performance of a microgrid electrical system wherein one or more processors are programmed to perform steps of the method. The method includes the steps of creating a first virtual system model of the microgrid electrical system, acquiring real-time data from sensors interfaced with components of the electrical system, calculating predicated data forecasting the cost of operating the microgrid electrical system and the reliability and availability of the microgrid electrical system, the predicted data being calculated using the first virtual system model of the microgrid electrical system, initiating a calibration and synchronization calibration and synchronization operation to update the first virtual system model when a difference between the real-time data and the predicted data exceeds a threshold, and recalculating the predicated data forecasting the cost of operating the microgrid electrical system and the reliability and availability of the microgrid electrical system using the calibrated first virtual system model of the microgrid electrical system.

These and other features, aspects, and embodiments of the invention are described below in the section entitled "Detailed Description."

BRIEF DESCRIPTION OF THE DRAWINGS

For a more complete understanding of the principles disclosed herein, and the advantages thereof, reference is now made to the following descriptions taken in conjunction with the accompanying drawings, in which.

DETAILED DESCRIPTION

Figure 1:
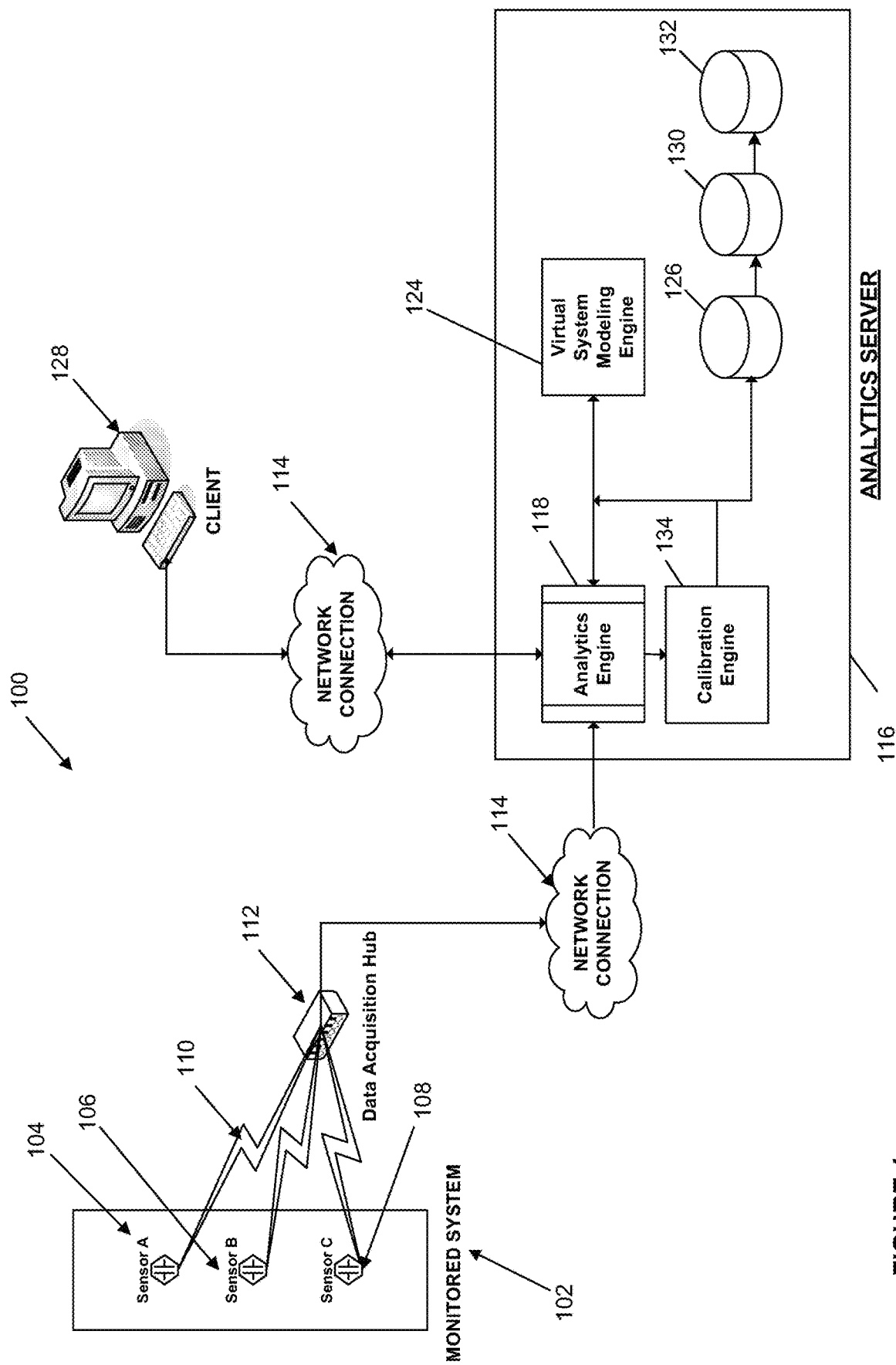
FIG. 1 is an illustration of a system for utilizing real-time data for predictive analysis of the performance of a monitored system, in accordance with one embodiment.

Systems and methods for optimizing energy consumption in multi-energy source sites, such as a microgrid, are provided. Techniques are provided for developing a real-time model and a virtual model of the electrical system of a multi-energy source site, such as a microgrid. The real-time model represents a current state of the electrical system can be developed by collecting data from sensors interfaced with the various components of the electrical system. The virtual model of the electrical system mirrors the real-time model of the electrical system and can be used to generate predictions regarding the performance, availability, and reliability of cost and reliability of various distributed energy sources and to predict the price of acquiring energy from these sources. The virtual model can be used to test "what if" scenarios, such as routine maintenance, system changes, and unplanned events that impact the electrical power network. The virtual model can also be used to predict the effect of various scenarios on microgrid utilization and capacity.

Conventional systems provide market-based pricing of distributed energy off-line and do not consider real-time power network conditions. Conventional systems also do not provide for real-time evaluation of microgrid or other distributed energy source data to predict impacts on availability and reliability of the microgrids or other distributed energy source. For example, the generation capacities of some microgrid distributed energy generation solutions, such as solar power generation system and wind turbine generation systems, that can be influenced by changing weather conditions. For example, solar power generation systems can be impacted by cloudy days and wind turbine generation systems can be impacted by changing wind conditions or a lack of wind. Both of these examples can impact the availability and reliability of the microgrid system.

The advanced power system modeling and analytics techniques provided herein address the shortcomings of conventional systems. These techniques include utilize a real-time model and a virtual model of a microgrid. The real-time model represents a current state of the electrical system can be developed by collecting data from sensors interfaced with the various components of the electrical system. The virtual model of the electrical system mirrors the real-time model of the electrical system and can be used to generate predictions regarding the performance, availability, and reliability of cost and reliability of various distributed energy sources and to predict the price of acquiring energy from these sources. This advanced power system modeling and associated analytics are vital to determining what power network constraints may exist that would negatively impact the microgrid. As these potential constraints are dynamic, iteratively monitoring the state of the microgrid using real-time data is essential to achieving a reliable and sustainable market forecast. For example, a typical microgrid includes local power generation sources, and these local generation sources are an important aspect of market optimization considerations. The operator of the microgrid can define a desired use or mix of generation sources that includes locally generated power from local power generation sources as well as power from other electrical providers from the macrogrid. However, the desired market optimizations cannot be realized if the desired mix of generation sources cannot be maintained for the duration of the period of time used to calculate the market optimizations. For example, some operators may use a rolling 24-hour period or rolling 12-hour period on which market optimizations are based, but if the desired mix of energy resources cannot be achieved throughout that entire period, the market optimizations cannot be realized. As described above, conventional systems for making market predictions do not include these real-time modeling of the microgrid, which can result in the inaccurate market forecasts. For example, if critical elements of the microgrid are already overloaded or unavailable (e.g., due to maintenance or other localized events), the conventional solutions may not recognize this problem because they do not use a real-time model of the microgrid as well as a virtual model of the microgrid when making forecasts. The systems and methods disclosed herein overcome these problems by using both a real-time model of the system that represents the current state of the system as well as a virtual model of the system can be adapted and synchronized to the changing conditions on the microgrid. As a result, the market forecasts generated by the techniques disclosed herein are more accurate and reliable than those generated by conventional systems.

Embodiments of the systems and methods disclosed herein can also be used to monitor operation of the smart grid and to control electricity trading with the macrogrid. For example, if the microgrid has excess capacity, electricity can be sold to the macrogrid. Conversely, if the utilization of the microgrid exceeds the microgrid capacity, electricity can be purchased from the macrogrid to meet the current utilization. The capacity of the microgrid can be monitored in real-time to determine whether electricity can be sold or electricity needs to be purchased from a utility company via the macrogrid. All transactions between the public electric service on the macrogrid and the microgrid infrastructure are closely monitored, and rate and pricing information for the management of electricity exchange are also maintained. Closely monitoring this information and updating the virtual and real time models accordingly allows the systems and methods disclosed herein to optimize energy consumption to meet various objectives of the microgrid operator. For example, objectives of a microgrid operator might include minimizing the annual cost of operation, minimizing the carbon footprint, minimizing the peak load, minimizing public utility consumption, or a combination thereof. These objectives can vary based on time, energy source reliability, or other factors that can impact the operating objectives of the microgrid operator.

As used herein, a system denotes a set of components, real or abstract, comprising a whole where each component interacts with or is related to at least one other component within the whole. Examples of systems include machinery, factories, electrical systems, processing plants, devices, chemical processes, biological systems, data centers, aircraft carriers, and the like. An electrical system can designate a power generation and/or distribution system that is widely dispersed, i.e., power generation, transformers, and/or electrical distribution components distributed geographically throughout a large region, or bounded within a particular location, e.g., a power plant within a production facility, a bounded geographic area, on board a ship, etc.

A network application is any application that is stored on an application server connected to a network, e.g., local area network, wide area network, etc., in accordance with any contemporary client/server architecture model and can be accessed via the network. In this arrangement, the network application programming interface (API) resides on the application server separate from the client machine. The client interface would typically be a web browser, e.g. INTERNET EXPLORER™, FIREFOX™, NETSCAPE™, etc., that is in communication with the network application server via a network connection, e.g., HTTP, HTTPS, RSS, etc.

FIG. 1 is an illustration of a system for utilizing real-time data for predictive analysis of the performance of a monitored system, in accordance with one embodiment. As shown herein, the system 100 includes a series of sensors, i.e., Sensor A 104, Sensor B 106, Sensor C 108, interfaced with the various components of a monitored system 102, a data acquisition hub 112, an analytics server 116, and a thin-client device 128. In one embodiment, the monitored system 102 is an electrical power generation plant. In another embodiment, the monitored system 102 is an electrical power transmission infrastructure. In still another embodiment, the monitored system 102 is an electrical power distribution system. In still another embodiment, the monitored system 102 includes a combination of one or more electrical power generation plant(s), power transmission infrastructure(s), and/or an electrical power distribution system. It should be understood that the monitored system 102 can be any combination of components whose operations can be monitored with conventional sensors and where each component interacts with or is related to at least one other component within the combination. For a monitored system 102 that is an electrical power generation, transmission, or distribution system, the sensors can provide data such as voltage, frequency, current, power, power factor, and the like. In an embodiment, the monitored system 102 is a microgrid system. The microgrid system can comprise electrical power generation components as well as electrical power distribution elements. The microgrid system can also be interfaced with the macrogrid. The microgrid can be monitored for excess capacity that can be used to generate electricity that can be sold over the public grid and/or for utilization that requires electricity to be purchased off of the macrogrid.

The sensors 104, 106 and 108 can be configured to provide output values for system parameters that indicate the operational status and/or "health" of the monitored system 102. For example, in an electrical power generation system, the current output or voltage readings for the various components that comprise the power generation system is indicative of the overall health and/or operational condition of the system. In one embodiment, the sensors are configured to also measure additional data that can affect system operation. For example, for an electrical power distribution system, the sensor output can include environmental information, e.g., temperature, humidity, etc., which can impact electrical power demand and can also affect the operation and efficiency of the power distribution system itself.

Continuing with FIG. 1, in one embodiment, the sensors 104, 106 and 108 can be configured to output data in an analog format. For example, electrical power sensor measurements, e.g., voltage, current, etc., are sometimes conveyed in an analog format as the measurements may be continuous in both time and amplitude. In another embodiment, the sensors 104, 106 and 108 can be configured to output data in a digital format. For example, the same electrical power sensor measurements can be taken in discrete time increments that are not continuous in time or amplitude. In still another embodiment, the sensors 104, 106 and 108 can be configured to output data in either an analog format, digital format, or both, depending on the sampling requirements of the monitored system 102.

The sensors 104, 106 and 108 can be configured to capture output data at split-second intervals to effectuate "real time" data capture. For example, in one embodiment, the sensors 104, 106 and 108 can be configured to generate hundreds of thousands of data readings per second. It should be appreciated, however, that the number of data output readings taken by a particular sensor can be set to any value as long as the operational limits of the sensor and the data processing capabilities of the data acquisition hub 112 are not exceeded.

Still referring to FIG. 1, each sensor 104, 106 and 108 can be communicatively connected to the data acquisition hub 112 via an analog or digital data connection 110. The data acquisition hub 112 can be a standalone unit or integrated within the analytics server 116 and can be embodied as a piece of hardware, software, or some combination thereof. In one embodiment, the data connection 110 is a "hard wired" physical data connection, e.g., serial, network, etc. For example, a serial or parallel cable connection between the sensor and the hub 112. In another embodiment, the data connection 110 is a wireless data connection. For example, a radio frequency (RF), BLUETOOTH™, infrared or equivalent connection between the sensor and the hub 112.

The data acquisition hub 112 can be configured to communicate "real-time" data from the monitored system 102 to the analytics server 116 using a network connection 114. In one embodiment, the network connection 114 is a "hard-wired" physical connection. For example, the data acquisition hub 112 can be communicatively connected, e.g., via Category 5 (CAT5), fiber optic, or equivalent cabling, to a data server (not shown) that is communicatively connected, e.g., via CAT5, fiber optic, or equivalent cabling, through the Internet and to the analytics server 116 server. The analytics server 116 can also be communicatively connected with the Internet, e.g., via CAT5, fiber optic, or equivalent cabling. In another embodiment, the network connection 114 can be a wireless network connection, e.g., Wi-Fi, WLAN, etc. For example, utilizing an 802.11b/g or equivalent transmission format. In practice, the network connection used is dependent upon the particular requirements of the monitored system 102.

Data acquisition hub 112 can also be configured to supply warning and alarms signals as well as control signals to monitored system 102 and/or sensors 104, 106, and 108 as described in more detail below.

As shown in FIG. 1, in one embodiment, the analytics server 116 can host an analytics engine 118, virtual system modeling engine 124, and several databases 126, 130, and 132. The virtual system modeling engine 124 can, e.g., be a computer modeling system, such as described above. In this context, however, the modeling engine 124 can be used to precisely model and mirror the actual electrical system. Analytics engine 118 can be configured to generate predicted data for the monitored system and analyze difference between the predicted data and the real-time data received from hub 112. In an embodiment, if the monitored system is a microgrid, the predicted data can include predictions on capacity and utilization. These predictions can be used to project whether the microgrid operations may meet the objectives of the microgrid operator, such as minimizing the annual cost of operations, minimizing the carbon footprint of the microgrid system, minimizing the peak load on the microgrid, minimizing public utility consumption, or a combination thereof. The microgrid operator can define a set of operational objectives. For example, a microgrid operator could define an objective that requires that utility power from the macrogrid only be used during off-peak hours in order to reduce operational costs, unless system reliability falls below 99.99%, at which time utility power can be used to ensure that the system reliability objectives are met.

Figure 2:
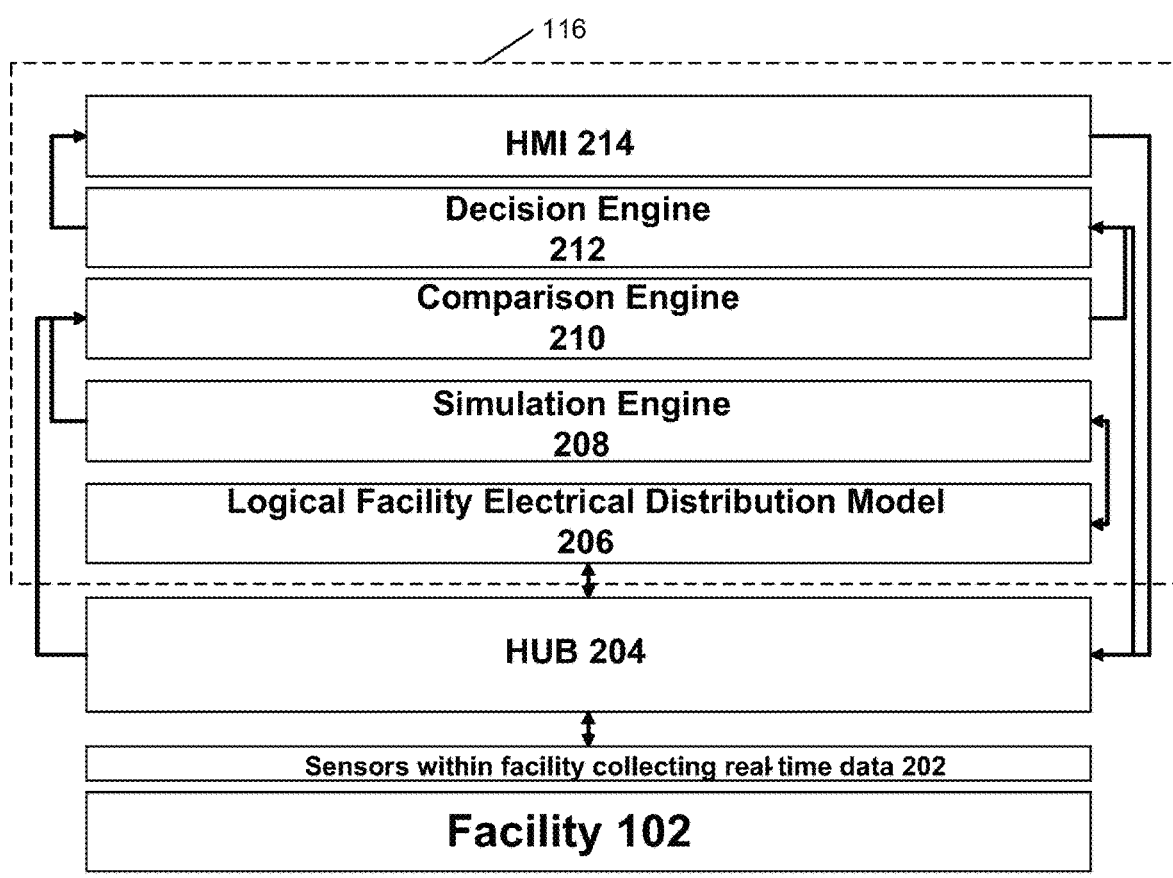
FIG. 2 is a diagram illustrating a detailed view of an analytics server included in the system of FIG. 1.

FIG. 2 is a diagram illustrating a more detailed view of analytic server 116. As can be seen, analytic server 116 is interfaced with a monitored facility 102 via sensors 202, e.g., sensors 104, 106, and 108. Sensors 202 are configured to supply real-time data from within monitored facility 102. The real-time data is communicated to analytic server 116 via a hub 204. Hub 204 can be configured to provide real-time data to server 116 as well as alarming, sensing, and control features for facility 102.

The real-time data from hub 204 can be passed to a comparison engine 210, which can form part of analytics engine 118. Comparison engine 210 can be configured to continuously compare the real-time data with predicted values generated by simulation engine 208. Based on the comparison, comparison engine 210 can be further configured to determine whether deviations between the real-time and the expected values exists, and if so to classify the deviation, e.g., high, marginal, low, etc. The deviation level can then be communicated to decision engine 212, which can also comprise part of analytics engine 118.

Decision engine 212 can be configured to look for significant deviations between the predicted values and real-time values as received from the comparison engine 210. If significant deviations are detected, decision engine 212 can also be configured to determine whether an alarm condition exists, activate the alarm and communicate the alarm to Human-Machine Interface (HMI) 214 for display in real-time via, e.g., thin client 128. Decision engine 212 can also be configured to perform root cause analysis for significant deviations in order to determine the interdependencies and identify the parent-child failure relationships that may be occurring. In this manner, parent alarm conditions are not drowned out by multiple children alarm conditions, allowing the user/operator to focus on the main problem, at least at first.

Thus, in one embodiment, and alarm condition for the parent can be displayed via HMI 214 along with an indication that processes and equipment dependent on the parent process or equipment are also in alarm condition. This also means that server 116 can maintain a parent-child logical relationship between processes and equipment comprising facility 102. Further, the processes can be classified as critical, essential, non-essential, etc.

Decision engine 212 can also be configured to determine health and performance levels and indicate these levels for the various processes and equipment via HMI 214. All of which, when combined with the analytic capabilities of analytics engine 118 allows the operator to minimize the risk of catastrophic equipment failure by predicting future failures and providing prompt, informative information concerning potential/predicted failures before they occur. Avoiding catastrophic failures reduces risk and cost, and maximizes facility performance and up time.

Simulation engine 208 operates on complex logical models 206 of facility 102. These models are continuously and automatically synchronized with the actual facility status based on the real-time data provided by hub 204. In other words, the models are updated based on current switch status, breaker status, e.g., open-closed, equipment on/off status, etc. Thus, the models are automatically updated based on such status, which allows simulation engine to produce predicted data based on the current facility status. This in turn, allows accurate and meaningful comparisons of the real-time data to the predicted data.

Example models 206 that can be maintained and used by server 116 include power flow models used to calculate expected kW, kVAR, power factor values, etc., short circuit models used to calculate maximum and minimum available fault currents, protection models used to determine proper protection schemes and ensure selective coordination of protective devices, power quality models used to determine voltage and current distortions at any point in the network, to name just a few. It will be understood that different models can be used depending on the system being modeled.

In certain embodiments, hub 204 is configured to supply equipment identification associated with the real-time data. This identification can be cross referenced with identifications provided in the models.

In one embodiment, if the comparison performed by comparison engine 210 indicates that the differential between the real-time sensor output value and the expected value exceeds a Defined Difference Tolerance (DDT) value, i.e., the "real-time" output values of the sensor output do not indicate an alarm condition, but below an alarm condition, i.e., alarm threshold value, a calibration request is generated by the analytics engine 118. If the differential exceeds the alarm condition, an alarm or notification message can be generated by the analytics engine 118. If the differential is below the DDT value, the analytics engine can do nothing and continues to monitor the real-time data and expected data.

In one embodiment, the alarm or notification message can be sent directly to the client or user) 128, e.g., via HMI 214, for display in real-time on a web browser, pop-up message box, e-mail, or equivalent on the client 128 display panel. In another embodiment, the alarm or notification message can be sent to a wireless mobile device, e.g., BLACKBERRY™, laptop, pager, etc., to be displayed for the user by way of a wireless router or equivalent device interfaced with the analytics server 116. In still another embodiment, the alarm or notification message can be sent to both the client 128 display and the wireless mobile device. The alarm can be indicative of a need for a repair event or maintenance to be done on the monitored system. It should be noted, however, that calibration requests should not be allowed if an alarm condition exists to prevent the models from being calibrated to an abnormal state.

Once the calibration is generated by the analytics engine 118, the various operating parameters or conditions of model(s) 206 can be updated or adjusted to reflect the actual facility configuration. This can include, but is not limited to, modifying the predicted data output from the simulation engine 208, adjusting the logic/processing parameters used by the model(s) 206, adding/subtracting functional elements from model(s) 206, etc. It should be understood that any operational parameter used by models 206 can be modified as long as the resulting modifications can be processed and registered by simulation engine 208.

Referring back to FIG. 1, models 206 can be stored in the virtual system model database 126. As noted, a variety of conventional virtual model applications can be used for creating a virtual system model, so that a wide variety of systems and system parameters can be modeled. For example, in the context of an electrical power distribution system, the virtual system model can include components for modeling reliability, modeling voltage stability, and modeling power flow. In addition, models 206 can include dynamic control logic that permits a user to configure the models 206 by specifying control algorithms and logic blocks in addition to combinations and interconnections of generators, governors, relays, breakers, transmission line, and the like. The voltage stability parameters can indicate capacity in terms of size, supply, and distribution, and can indicate availability in terms of remaining capacity of the presently configured system. The power flow model can specify voltage, frequency, and power factor, thus representing the "health" of the system.

All of models 206 can be referred to as a virtual system model. Thus, a virtual system model database 130 can be configured to store the virtual system model. A duplicate, but synchronized copy of the virtual system model can be stored in a virtual simulation model database 130. This duplicate model can be used for what-if simulations. In other words, this model can be used to allow a system designer to make hypothetical changes to the facility and test the resulting effect, without taking down the facility or costly and time consuming analysis. Such hypothetical can be used to learn failure patterns and signatures as well as to test proposed modifications, upgrades, additions, etc., for the facility. The real-time data, as well as trending produced by analytics engine 118 can be stored in a real-time data acquisition database 132.

As discussed above, the virtual system model is periodically calibrated and synchronized with "real-time" sensor data outputs so that the virtual system model provides data output values that are consistent with the actual "real-time" values received from the sensor output signals. Unlike conventional systems that use virtual system models primarily for system design and implementation purposes, i.e., offline simulation and facility planning, the virtual system models described herein are updated and calibrated with the real-time system operational data to provide better predictive output values. A divergence between the real-time sensor output values and the predicted output values generate either an alarm condition for the values in question and/or a calibration request that is sent to the calibration engine 134.

Continuing with FIG. 1, the analytics engine 118 can be configured to implement pattern/sequence recognition into a real-time decision loop that, e.g., is enabled by a new type of machine learning called associative memory, or hierarchical temporal memory (HTM), which is a biological approach to learning and pattern recognition. Associative memory allows storage, discovery, and retrieval of learned associations between extremely large numbers of attributes in real time. At a basic level, an associative memory stores information about how attributes and their respective features occur together. The predictive power of the associative memory technology comes from its ability to interpret and analyze these co-occurrences and to produce various metrics. Associative memory is built through "experiential" learning in which each newly observed state is accumulated in the associative memory as a basis for interpreting future events. Thus, by observing normal system operation over time, and the normal predicted system operation over time, the associative memory is able to learn normal patterns as a basis for identifying non-normal behavior and appropriate responses, and to associate patterns with particular outcomes, contexts or responses. The analytics engine 118 is also better able to understand component mean time to failure rates through observation and system availability characteristics. This technology in combination with the virtual system model can be characterized as a "neocortical" model of the system under management This approach also presents a novel way to digest and comprehend alarms in a manageable and coherent way. The neocortical model could assist in uncovering the patterns and sequencing of alarms to help pinpoint the location of the (impending) failure, its context, and even the cause. Typically, responding to the alarms is done manually by experts who have gained familiarity with the system through years of experience. However, at times, the amount of information is so great that an individual cannot respond fast enough or does not have the necessary expertise. An "intelligent" system like the neocortical system that observes and recommends possible responses could improve the alarm management process by either supporting the existing operator, or even managing the system autonomously.

Current simulation approaches for maintaining transient stability involve traditional numerical techniques and typically do not test all possible scenarios. The problem is further complicated as the numbers of components and pathways increase. Through the application of the neocortical model, by observing simulations of circuits, and by comparing them to actual system responses, it may be possible to improve the simulation process, thereby improving the overall design of future circuits.

The virtual system model database 126, as well as databases 130 and 132, can be configured to store one or more virtual system models, virtual simulation models, and real-time data values, each customized to a particular system being monitored by the analytics server 118. Thus, the analytics server 118 can be used to monitor more than one system at a time. As depicted herein, the databases 126, 130, and 132 can be hosted on the analytics server 116 and communicatively interfaced with the analytics engine 118. In other embodiments, databases 126, 130, and 132 can be hosted on a separate database server (not shown) that is communicatively connected to the analytics server 116 in a manner that allows the virtual system modeling engine 124 and analytics engine 118 to access the databases as needed.

Therefore, in one embodiment, the client 128 can modify the virtual system model stored on the virtual system model database 126 by using a virtual system model development interface using well-known modeling tools that are separate from the other network interfaces. For example, dedicated software applications that run in conjunction with the network interface to allow a client 128 to create or modify the virtual system models.

The client 128 can use a variety of network interfaces, e.g., web browser, CITRIX™, WINDOWS TERMINAL SERVICES™, telnet, or other equivalent thin-client terminal applications, etc., to access, configure, and modify the sensors, e.g., configuration files, etc., analytics engine 118, e.g., configuration files, analytics logic, etc., calibration parameters, e.g., configuration files, calibration parameters, etc., virtual system modeling engine 124, e.g., configuration files, simulation parameters, etc., and virtual system model of the system under management, e.g., virtual system model operating parameters and configuration files. Correspondingly, data from those various components of the monitored system 102 can be displayed on a client 128 display panel for viewing by a system administrator or equivalent.

Figure 3:
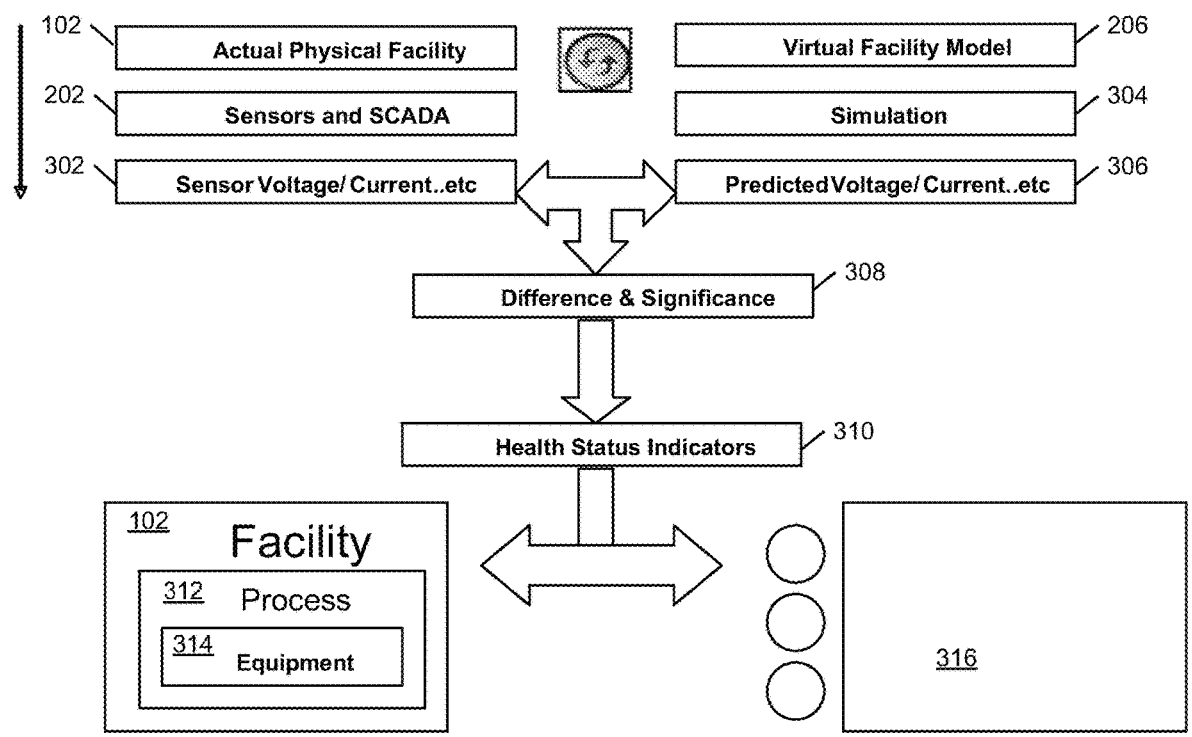
FIG. 3 is a diagram illustrating how the system of FIG. 1 operates to synchronize the operating parameters between a physical facility and a virtual system model of the facility.

As described above, server 116 is configured to synchronize the physical world with the virtual and report, e.g., via visual, real-time display, deviations between the two as well as system health, alarm conditions, predicted failures, etc. This is illustrated with the aid of FIG. 3, in which the synchronization of the physical world (left side) and virtual world (right side) is illustrated. In the physical world, sensors 202 produce real-time data 302 for the processes 312 and equipment 314 that make up facility 102. In the virtual world, simulations 304 of the virtual system model 206 provide predicted values 306, which are correlated and synchronized with the real-time data 302. The real-time data can then be compared to the predicted values so that differences 308 can be detected. The significance of these differences can be determined to determine the health status 310 of the system. The health stats can then be communicated to the processes 312 and equipment 314, e.g., via alarms and indicators, as well as to thin client 128, e.g., via web pages 316.

Figure 4:
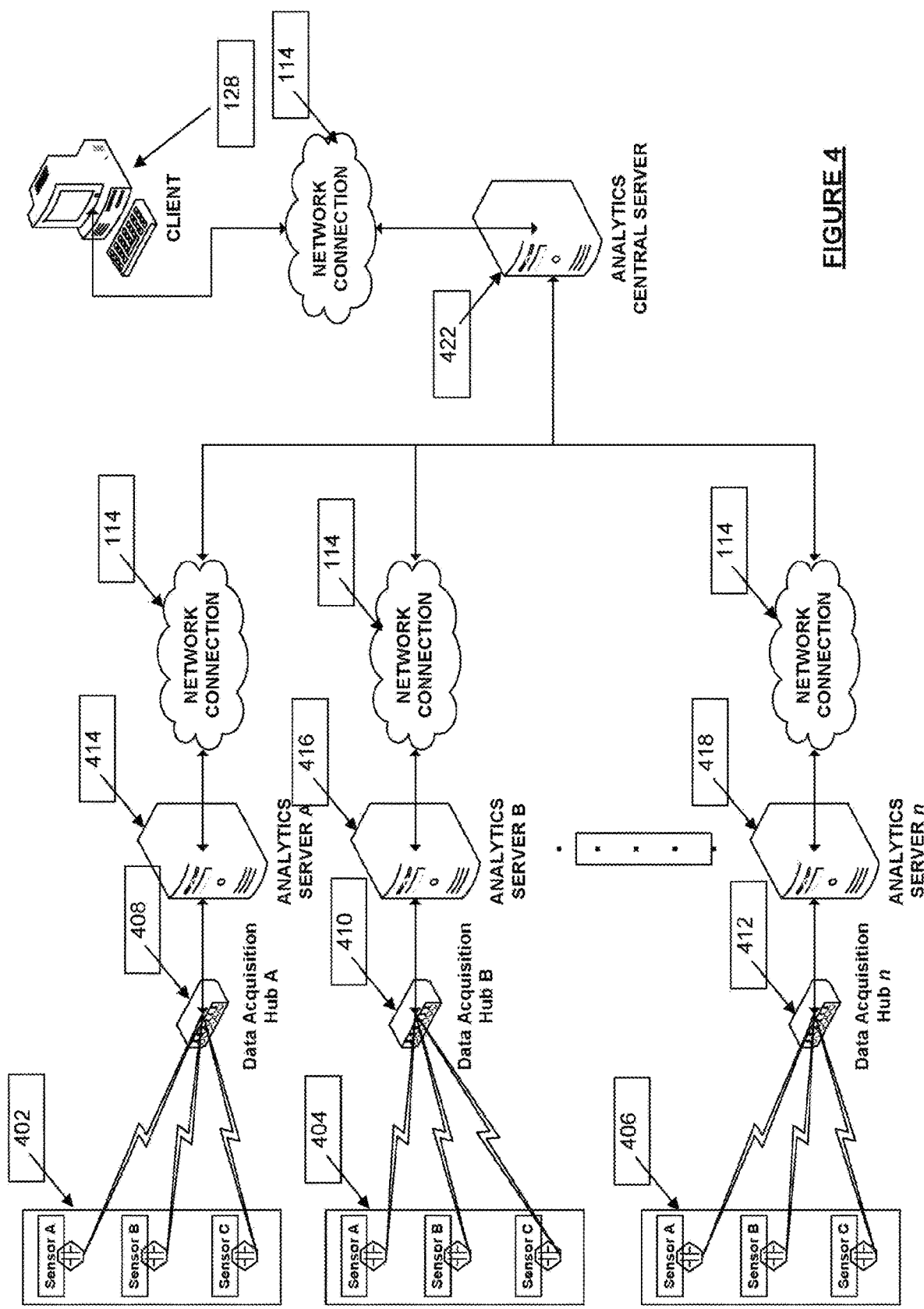
FIG. 4 is an illustration of the scalability of a system for utilizing real-time data for predictive analysis of the performance of a monitored system, in accordance with one embodiment.

FIG. 4 is an illustration of the scalability of a system for utilizing real-time data for predictive analysis of the performance of a monitored system, in accordance with one embodiment. As depicted herein, an analytics central server 422 is communicatively connected with analytics server A 414, analytics server B 416, and analytics server n 418, i.e., one or more other analytics servers, by way of one or more network connections 114. Each of the analytics servers 414, 416, and 418 is communicatively connected with a respective data acquisition hub, i.e., Hub A 408, Hub B 410, Hub n 412, which communicates with one or more sensors that are interfaced with a system, i.e., Monitored System A 402, Monitored System B 404, Monitored System n 406, which the respective analytical server monitors. For example, analytics server A 414 is communicative connected with data acquisition hub A 408, which communicates with one or more sensors interfaced with monitored system A 402. According to an embodiment, the Monitored System A 402, Monitored System B 404, Monitored System n 406 can be distributed generation systems, such as microgrid systems. In an embodiment, multiple distributed energy generation systems might be used by a microgrid system. For example, a university campus might include multiple distributed energy generation sources, such as solar panel arrays, wind turbines, and other on-premise power generation systems. Each of the distributed energy solutions could be treated as separate monitored systems that are managed via the analytics central server 422. In another example, a university might have multiple campuses that each have their own microgrid for on-site power generation and each campus can be treated a separate monitored system that is administered from a central location.

Each analytics server, i.e., analytics server A 414, analytics server B 416, analytics server n 418, can be configured to monitor the sensor output data of its corresponding monitored system and feed that data to the central analytics server 422. Additionally, each of the analytics servers 414, 416 and 418 can function as a proxy agent of the central analytics server 422 during the modifying and/or adjusting of the operating parameters of the system sensors they monitor. For example, analytics server B 416 can be configured as a proxy to modify the operating parameters of the sensors interfaced with monitored system B 404.

Moreover, the central analytics server 422, which is communicatively connected to one or more analytics server(s), can be used to enhance the scalability. For example, a central analytics server 422 can be used to monitor multiple electrical power generation facilities, i.e., monitored system A 402 can be a power generation facility located in city A while monitored system B 404 is a power generation facility located in city B, on an electrical power grid. In this example, the number of electrical power generation facilities that can be monitored by central analytics server 422 is limited only by the data processing capacity of the central analytics server 422. As described above, central analytics server 422 can be used to monitor multiple distributed electrical power generation facilities that are part of a microgrid.

The central analytics server 422 can be configured to enable a client 128 to modify and adjust the operational parameters of any the analytics servers communicatively connected to the central analytics server 422. Furthermore, as discussed above, each of the analytics servers 414, 416 and 418 can be configured to serve as proxies for the central analytics server 422 to enable a client 128 to modify and/or adjust the operating parameters of the sensors interfaced with the systems that they respectively monitor. For example, the client 128 can use the central analytics server 422, and vice versa, to modify and/or adjust the operating parameters of analytics server A 414 and use the same to modify and/or adjust the operating parameters of the sensors interfaced with monitored system A 402. Additionally, each of the analytics servers can be configured to allow a client 128 to modify the virtual system model through a virtual system model development interface using well-known modeling tools.

In one embodiment, the central analytics server 422 can function to monitor and control a monitored system when its corresponding analytics server is out of operation. For example, central analytics server 422 can take over the functionality of analytics server B 416 when the server 416 is out of operation. That is, the central analytics server 422 can monitor the data output from monitored system B 404 and modify and/or adjust the operating parameters of the sensors that are interfaced with the system 404.

In one embodiment, the network connection 114 is established through a wide area network (WAN) such as the Internet. In another embodiment, the network connection is established through a local area network (LAN) such as the company intranet. In a separate embodiment, the network connection 114 is a "hardwired" physical connection. For example, the data acquisition hub 112 can be communicatively connected, e.g., via Category 5 (CAT5), fiber optic, or equivalent cabling, to a data server that is communicatively connected, e.g., via CAT5, fiber optic, or equivalent cabling, through the Internet and to the analytics server 116 server hosting the analytics engine 118. In another embodiment, the network connection 114 is a wireless network connection, e.g., Wi-Fi, WLAN, etc. For example, utilizing an 802.11b/g or equivalent transmission format.

In certain embodiments, regional analytics servers can be placed between local analytics servers 414, 416, 418 and central analytics server 422. Further, in certain embodiments a disaster recovery site can be included at the central analytics server 422 level.

Figure 5:
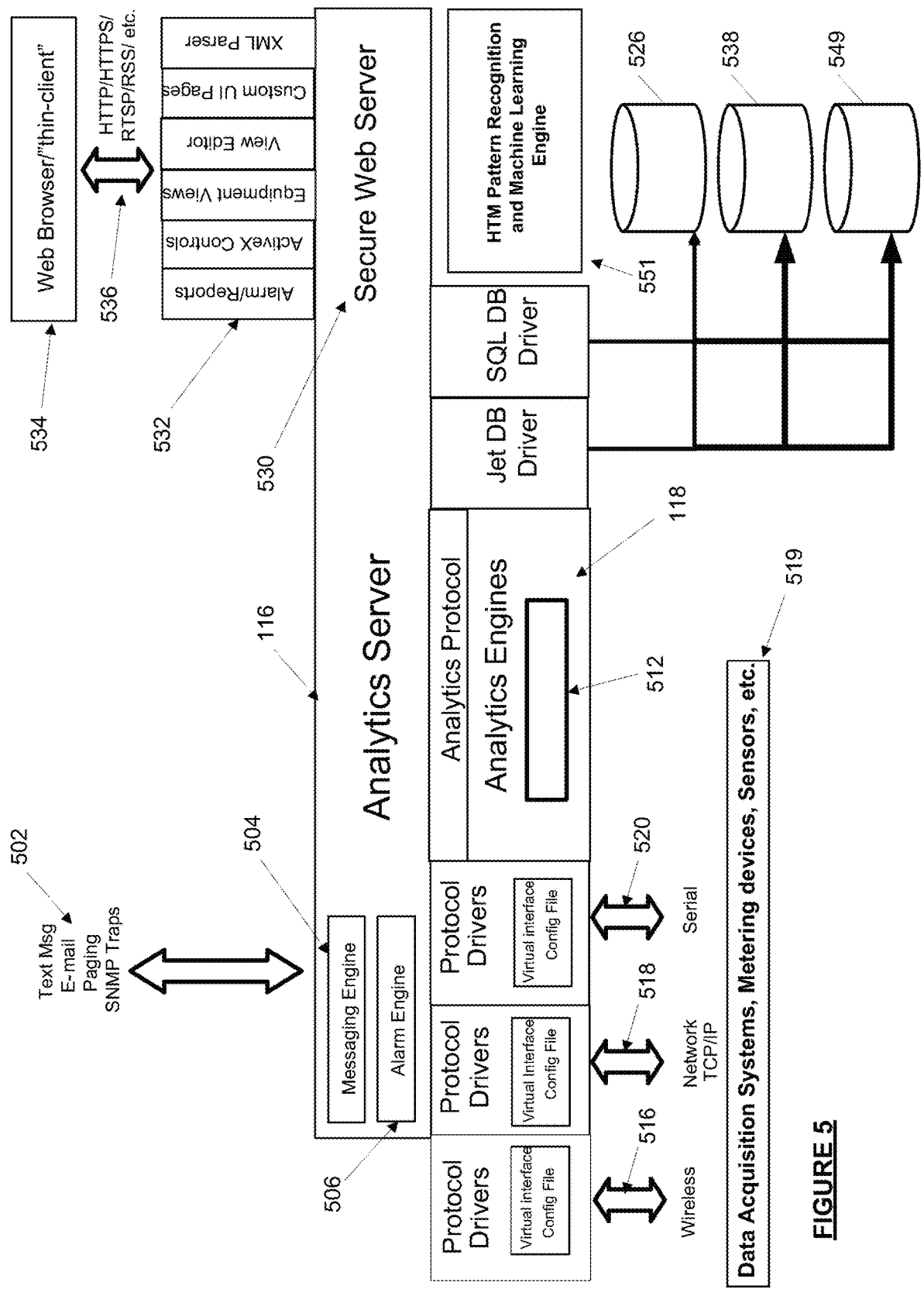
FIG. 5 is a block diagram that shows the configuration details of the system illustrated in FIG. 1, in accordance with one embodiment.

FIG. 5 is a block diagram that shows the configuration details of analytics server 116 illustrated in FIG. 1 in more detail. It should be understood that the configuration details in FIG. 5 are merely one embodiment of the items described for FIG. 1, and it should be understood that alternate configurations and arrangements of components could also provide the functionality described herein.

The analytics server 116 includes a variety of components. In the example of FIG. 5, the analytics server 116 is implemented in a Web-based configuration, so that the analytics server 116 includes, or communicates with, a secure web server 530 for communication with the sensor systems 519, e.g., data acquisition units, metering devices, sensors, etc., and external communication entities 534, e.g., web browser, "thin client" applications, etc. A variety of user views and functions 532 are available to the client 128 such as: alarm reports, Active X controls, equipment views, view editor tool, custom user interface page, and XML parser. It should be appreciated, however, that these are just examples of a few in a long list of views and functions 532 that the analytics server 116 can deliver to the external communications entities 534 and are not meant to limit the types of views and functions 532 available to the analytics server 116 in any way.

The analytics server 116 also includes an alarm engine 506 and messaging engine 504, for the aforementioned external communications. The alarm engine 506 is configured to work in conjunction with the messaging engine 504 to generate alarm or notification messages 502, in the form of text messages, e-mails, paging, etc., in response to the alarm conditions previously described. The analytics server 116 determines alarm conditions based on output data it receives from the various sensor systems 519 through a communications connection, e.g., wireless 516, TCP/IP 518, Serial 520, etc., and simulated output data from a virtual system model 512, of the monitored system, processed by the analytics engines 118. In one embodiment, the virtual system model 512 can be created by a user through interacting with an external communication entity 534 by specifying the components that comprise the monitored system and by specifying relationships between the components of the monitored system. In another embodiment, the virtual system model 512 can be automatically generated by the analytics engines 118 as components of the monitored system are brought online and interfaced with the analytics server 508.

Continuing with FIG. 5, a virtual system model database 526 can be communicatively connected with the analytics server 116 and can be configured to store one or more virtual system models 512, each of which represents a particular monitored system. For example, the analytics server 116 can conceivably monitor multiple electrical power generation systems, e.g., system A, system B, system C, etc., spread across a wide geographic area, e.g., City A, City B, City C, etc. Therefore, the analytics server 116 can use a different virtual system model 512 for each of the electrical power generation systems that it monitors. Virtual simulation model database 538 can be configured to store a synchronized, duplicate copy of the virtual system model 512, and real-time data acquisition database 540 can store the real-time and trending data for the system(s) being monitored.

Thus, in operation, analytics server 116 can receive real-time data for various sensors, i.e., components, through data acquisition system 202. As can be seen, analytics server 116 can comprise various drivers configured to interface with the various types of sensors, etc., comprising data acquisition system 202. This data represents the real-time operational data for the various components. For example, the data can indicate that a certain component is operating at a certain voltage level and drawing certain amount of current. This information can then be fed to a modeling engine to generate a virtual system model 512 that is based on the actual real-time operational data.

Analytics engine 118 can be configured to compare predicted data based on the virtual system model 512 with real-time data received from data acquisition system 202 and to identify any differences. In some instances, analytics engine can be configured to identify these differences and then update, i.e., calibrate, the virtual system model 512 for use in future comparisons. In this manner, more accurate comparisons and warnings can be generated.

But in other instances, the differences will indicate a failure, or the potential for a failure. For example, when a component begins to fail, the operating parameters will begin to change. This change may be sudden or it may be a progressive change over time. Analytics engine 118 can detect such changes and issue warnings that can allow the changes to be detected before a failure occurs. The analytic engine 118 can be configured to generate warnings that can be communicated via interface 532.

For example, a user can access information from server 116 using thin client 534. For example, reports can be generated and served to thin client 534 via server 540. These reports can, for example, comprise schematic or symbolic illustrations of the system being monitored. Status information for each component can be illustrated or communicated for each component. This information can be numerical, i.e., the voltage or current level, or it can be symbolic, i.e., green for normal, red for failure or warning. In certain embodiments, intermediate levels of failure can also be communicated, i.e., yellow can be used to indicate operational conditions that project the potential for future failure. It should be noted that this information can be accessed in real-time. Moreover, via thin client 534, the information can be accessed from anywhere and anytime.

Continuing with FIG. 5, the Analytics Engine 118 is communicatively interfaced with a HTM pattern recognition and machine learning engine 551. The HTM engine 551 can be configured to work in conjunction with the analytics engine 118 and a virtual system model of the monitored system to make real-time predictions, i.e., forecasts, about various operational aspects of the monitored system. The HTM engine 551 works by processing and storing patterns observed during the normal operation of the monitored system over time. These observations are provided in the form of real-time data captured using a multitude of sensors that are imbedded within the monitored system. In one embodiment, the virtual system model can also be updated with the real-time data such that the virtual system model "ages" along with the monitored system. Examples of a monitored system can include machinery, factories, electrical systems, processing plants, devices, chemical processes, biological systems, data centers, aircraft carriers, and the like. It should be understood that the monitored system can be any combination of components whose operations can be monitored with conventional sensors and where each component interacts with or is related to at least one other component within the combination.

Figure 6:
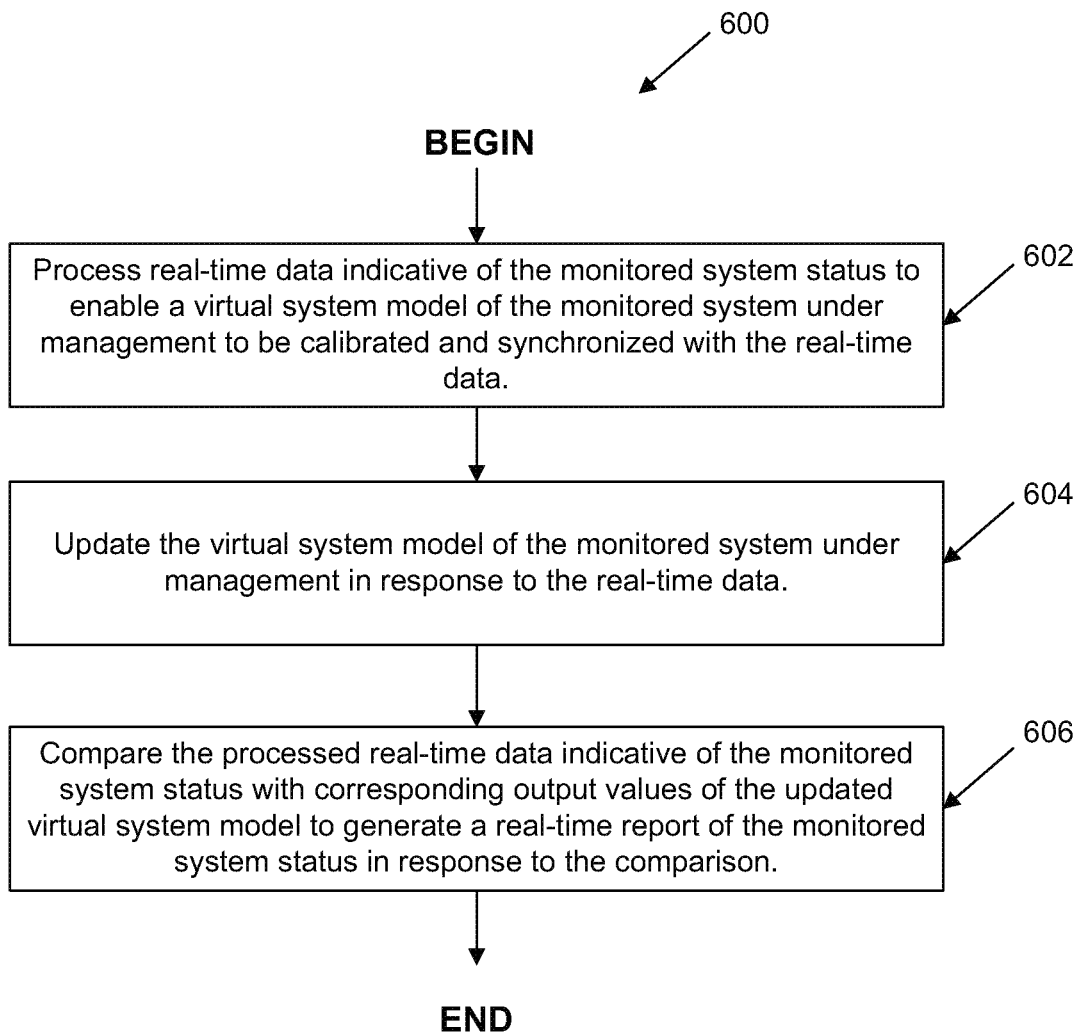
FIG. 6 is an illustration of a flowchart describing a method for real-time monitoring and predictive analysis of a monitored system, in accordance with one embodiment.

FIG. 6 is a flowchart describing a method for real-time monitoring and predictive analysis of a monitored system, in accordance with one embodiment. Method 600 begins with operation 602 where real-time data indicative of the monitored system status is processed to enable a virtual model of the monitored system under management to be calibrated and synchronized with the real-time data. In one embodiment, the monitored system 102 is a mission critical electrical power system. In another embodiment, the monitored system 102 can include an electrical power transmission infrastructure. In still another embodiment, the monitored system 102 includes a combination of thereof. It should be understood that the monitored system 102 can be any combination of components whose operations can be monitored with conventional sensors and where each component interacts with or is related to at least one other component within the combination.

Method 600 moves on to operation 604 where the virtual system model of the monitored system under management is updated in response to the real-time data. This may include, but is not limited to, modifying the simulated data output from the virtual system model, adjusting the logic/processing parameters utilized by the virtual system modeling engine to simulate the operation of the monitored system, adding/subtracting functional elements of the virtual system model, etc. It should be understood, that any operational parameter of the virtual system modeling engine and/or the virtual system model may be modified by the calibration engine as long as the resulting modifications can be processed and registered by the virtual system modeling engine.

Method 600 proceeds on to operation 606 where the simulated real-time data indicative of the monitored system status is compared with a corresponding virtual system model created at the design stage. The design stage models, which may be calibrated and updated based on real-time monitored data, are used as a basis for the predicted performance of the system. The real-time monitored data can then provide the actual performance over time. By comparing the real-time time data with the predicted performance information, difference can be identified a tracked by, e.g., the analytics engine 118. Analytics engines 118 can then track trends, determine alarm states, etc., and generate a real-time report of the system status in response to the comparison.

In other words, the analytics can be used to analyze the comparison and real-time data and determine if there is a problem that should be reported and what level the problem may be, e.g., low priority, high priority, critical, etc. The analytics can also be used to predict future failures and time to failure, etc. In one embodiment, reports can be displayed on a conventional web browser (e.g. INTERNET EXPLORER™, FIREFOX™, NETSCAPE™, etc., which can be rendered on a standard personal computing (PC) device. In another embodiment, the "real-time" report can be rendered on a "thin-client" computing device, e.g., CITRIX™, WINDOWS TERMINAL SERVICES™, telnet, or other equivalent thin-client terminal application. In still another embodiment, the report can be displayed on a wireless mobile device, e.g., BLACKBERRY™, laptop, pager, etc. For example, in one embodiment, the "real-time" report can include such information as the differential in a particular power parameter, i.e., current, voltage, etc., between the real-time measurements and the virtual output data.

Figure 7:
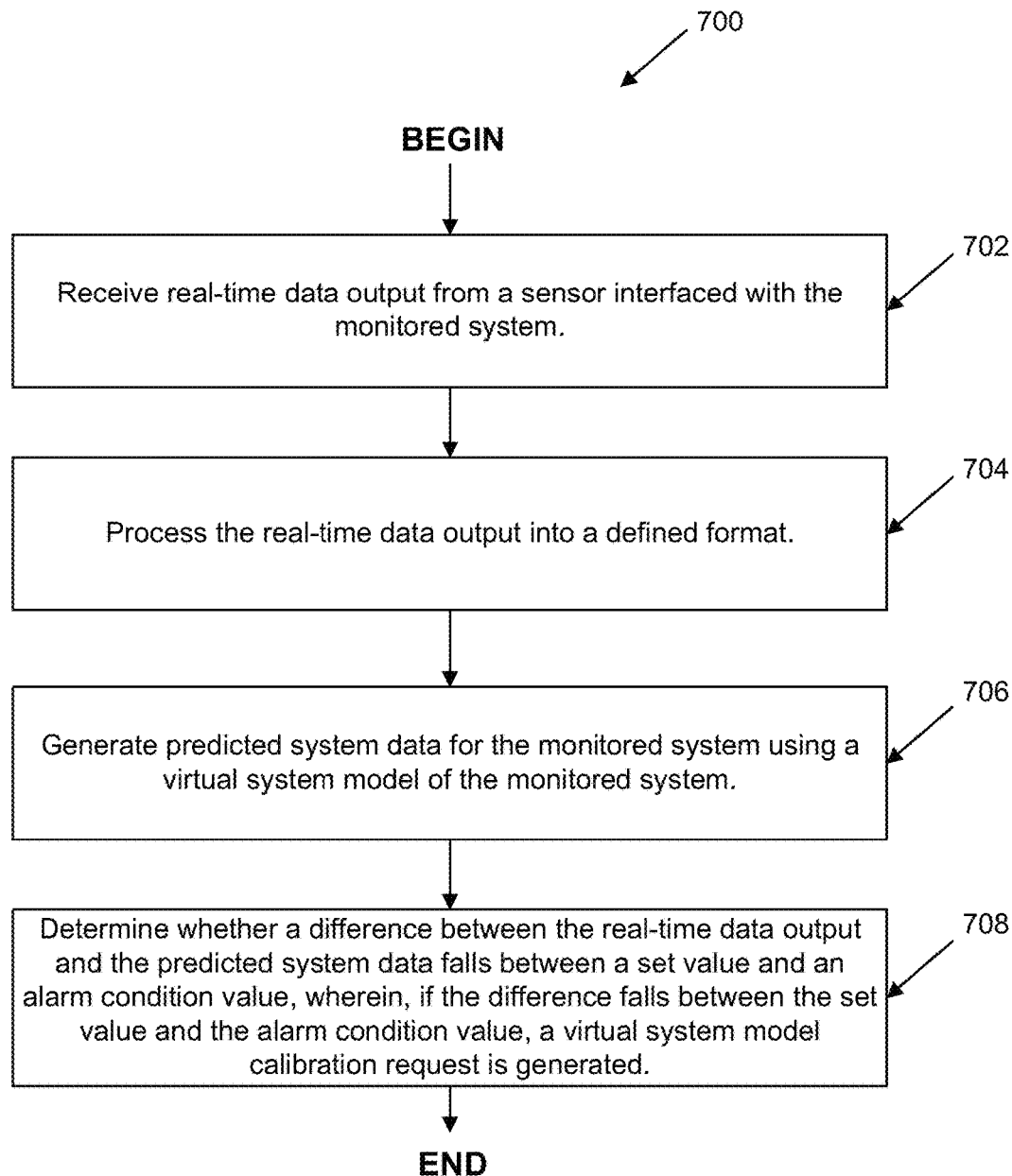
FIG. 7 is an illustration of a flowchart describing a method for managing real-time updates to a virtual system model of a monitored system, in accordance with one embodiment.

FIG. 7 is a flowchart describing a method for managing real-time updates to a virtual system model of a monitored system, in accordance with one embodiment. Method 700 begins with operation 702 where real-time data output from a sensor interfaced with the monitored system is received. The sensor is configured to capture output data at split-second intervals to effectuate "real time" data capture. For example, in one embodiment, the sensor is configured to generate hundreds of thousands of data readings per second. It should be appreciated, however, that the number of data output readings taken by the sensor may be set to any value as long as the operational limits of the sensor and the data processing capabilities of the data acquisition hub are not exceeded.

Method 700 moves to operation 704 where the real-time data is processed into a defined format. This would be a format that can be used by the analytics server to analyze or compare the data with the simulated data output from the virtual system model. In one embodiment, the data is converted from an analog signal to a digital signal. In another embodiment, the data is converted from a digital signal to an analog signal. It should be understood, however, that the real-time data may be processed into any defined format as long as the analytics engine can utilize the resulting data in a comparison with simulated output data from a virtual system model of the monitored system.

Method 700 continues on to operation 706 where the predicted, i.e., simulated, data for the monitored system is generated using a virtual system model of the monitored system. As discussed above, a virtual system modeling engine uses dynamic control logic stored in the virtual system model to generate the predicted output data. The predicted data is supposed to be representative of data that should actually be generated and output from the monitored system.

Method 700 proceeds to operation 708 where a determination is made as to whether the difference between the real-time data output and the predicted system data falls between a set value and an alarm condition value, where if the difference falls between the set value and the alarm condition value a virtual system model calibration and a response can be generated. That is, if the comparison indicates that the differential between the "real-time" sensor output value and the corresponding "virtual" model data output value exceeds a Defined Difference Tolerance (DDT) value, i.e., the "real-time" output values of the sensor output do not indicate an alarm condition, but below an alarm condition, i.e., alarm threshold value, a response can be generated by the analytics engine. In one embodiment, if the differential exceeds the alarm condition, an alarm or notification message is generated by the analytics engine 118. In another embodiment, if the differential is below the DDT value, the analytics engine does nothing and continues to monitor the "real-time" data and "virtual" data. Generally speaking, the comparison of the set value and alarm condition is indicative of the functionality of one or more components of the monitored system.

Figure 8:
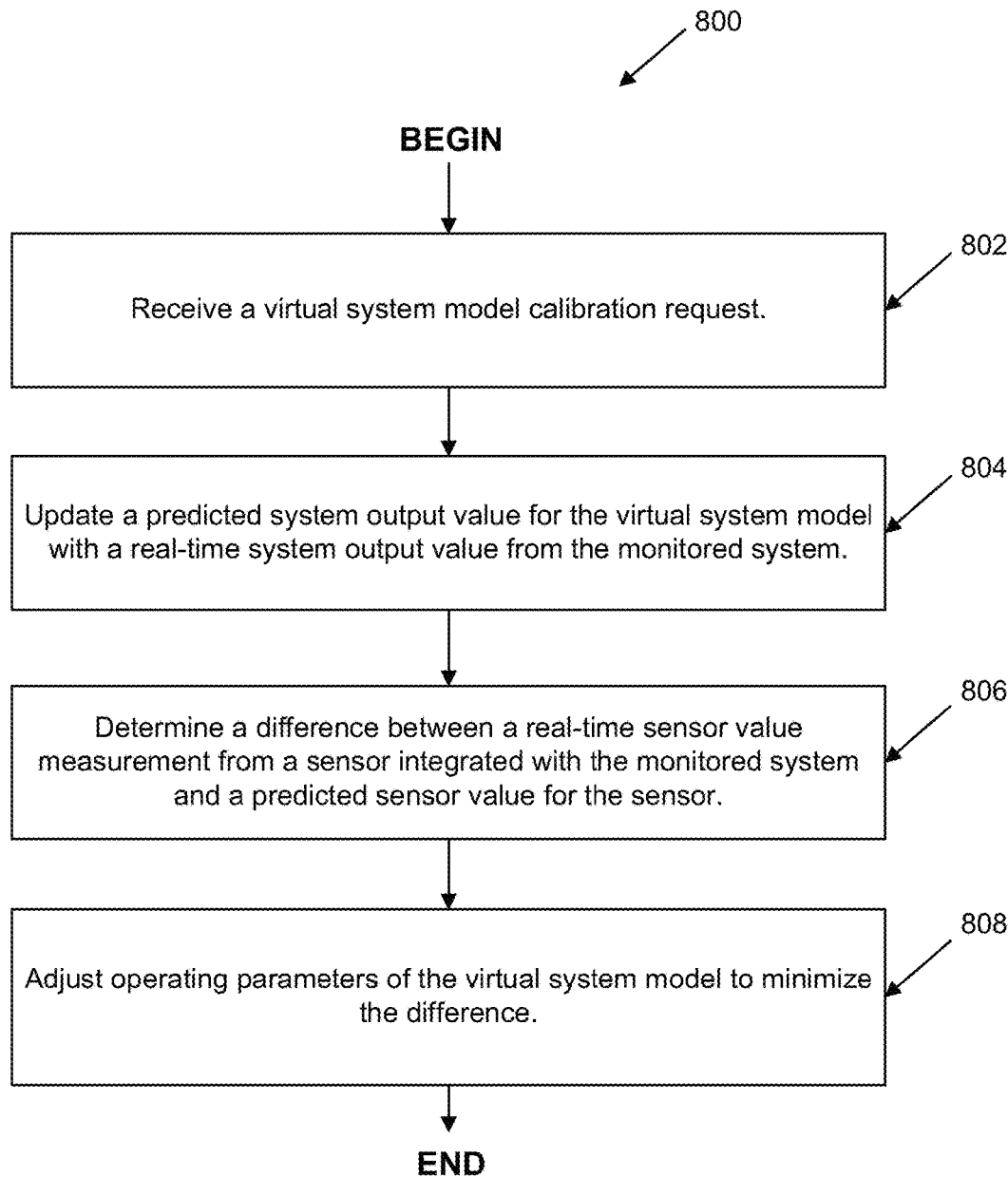
FIG. 8 is an illustration of a flowchart describing a method for synchronizing real-time system data with a virtual system model of a monitored system, in accordance with one embodiment.

FIG. 8 is a flowchart describing a method for synchronizing real-time system data with a virtual system model of a monitored system, in accordance with one embodiment. Method 800 begins with operation 802 where a virtual system model calibration request is received. A virtual model calibration request can be generated by an analytics engine whenever the difference between the real-time data output and the predicted system data falls between a set value and an alarm condition value.

Method 800 proceeds to operation 804 where the predicted system output value for the virtual system model is updated with a real-time output value for the monitored system. For example, if sensors interfaced with the monitored system outputs a real-time current value of A, then the predicted system output value for the virtual system model is adjusted to reflect a predicted current value of A.

Method 800 moves on to operation 806 where a difference between the real-time sensor value measurement from a sensor integrated with the monitored system and a predicted sensor value for the sensor is determined. As discussed above, the analytics engine is configured to receive "real-time" data from sensors interfaced with the monitored system via the data acquisition hub, or, alternatively directly from the sensors, and "virtual" data from the virtual system modeling engine simulating the data output from a virtual system model of the monitored system. In one embodiment, the values are in units of electrical power output, i.e., current or voltage, from an electrical power generation or transmission system. It should be appreciated, however, that the values can essentially be any unit type as long as the sensors can be configured to output data in those units or the analytics engine can convert the output data received from the sensors into the desired unit type before performing the comparison.

Method 800 continues on to operation 808 where the operating parameters of the virtual system model are adjusted to minimize the difference. This means that the logic parameters of the virtual system model that a virtual system modeling engine uses to simulate the data output from actual sensors interfaced with the monitored system are adjusted so that the difference between the real-time data output and the simulated data output is minimized. Correspondingly, this operation will update and adjust any virtual system model output parameters that are functions of the virtual system model sensor values. For example, in a power distribution environment, output parameters of power load or demand factor might be a function of multiple sensor data values. The operating parameters of the virtual system model that mimic the operation of the sensor will be adjusted to reflect the real-time data received from those sensors. In one embodiment, authorization from a system administrator is requested prior to the operating parameters of the virtual system model being adjusted. This is to ensure that the system administrator is aware of the changes that are being made to the virtual system model. In one embodiment, after the completion of all the various calibration operations, a report is generated to provide a summary of all the adjustments that have been made to the virtual system model.

As described above, virtual system modeling engine 124 can be configured to model various aspects of the system to produce predicted values for the operation of various components within monitored system 102. These predicted values can be compared to actual values being received via data acquisition hub 112. If the differences are greater than a certain threshold, e.g., the DDT, but not in an alarm condition, then a calibration instruction can be generated. The calibration instruction can cause a calibration engine 134 to update the virtual model being used by system modeling engine 124 to reflect the new operating information.

It will be understood that as monitored system 102 ages, or more specifically the components comprising monitored system 102 age, then the operating parameters, e.g., currents and voltages associated with those components will also change. Thus, the process of calibrating the virtual model based on the actual operating information provides a mechanism by which the virtual model can be aged along with the monitored system 102 so that the comparisons being generated by analytics engine 118 are more meaningful.

Figure 9:
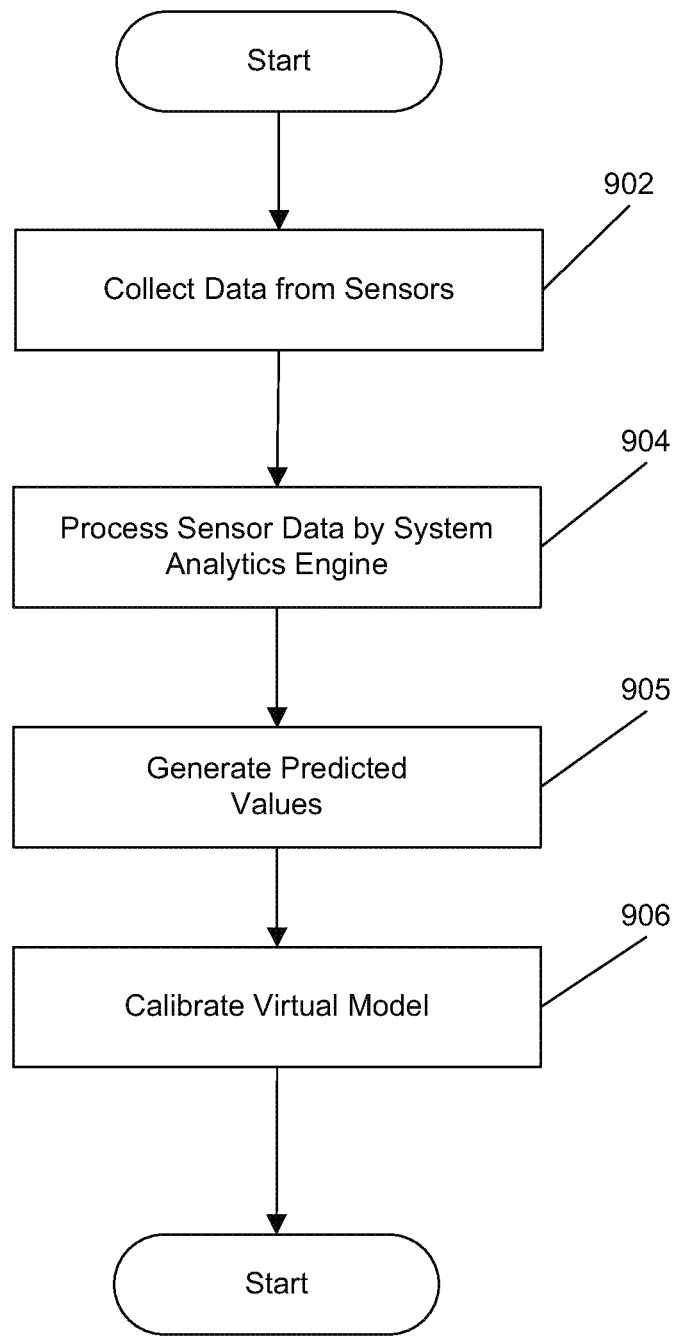
FIG. 9 is a flow chart illustrating an example method for updating the virtual model in accordance with one embodiment.

At a high level, this process can be illustrated with the aid of FIG. 9, which is a flow chart illustrating an example method for updating the virtual model in accordance with one embodiment. In step 902, data is collected from, e.g., sensors 104, 106, and 108. For example, the sensors can be configured to monitor protective devices within an electrical distribution system to determine and monitor the ability of the protective devices to withstand faults, which is describe in more detail below.

In step 904, the data from the various sensors can be processed by analytics engine 118 in order to evaluate various parameters related to monitored system 102. In step 905, simulation engine 124 can be configured to generate predicted values for monitored system 102 using a virtual model of the system that can be compared to the parameters generated by analytics engine 118 in step 904. If there are differences between the actual values and the predicted values, then the virtual model can be updated to ensure that the virtual model ages with the actual system 102.

It should be noted that as the monitored system 102 ages, various components can be repaired, replaced, or upgraded, which can also create differences between the simulated and actual data that is not an alarm condition. Such activity can also lead to calibrations of the virtual model to ensure that the virtual model produces relevant predicted values. Thus, not only can the virtual model be updated to reflect aging of monitored system 102, but it can also be updated to reflect retrofits, repairs, etc.

Figure 10:
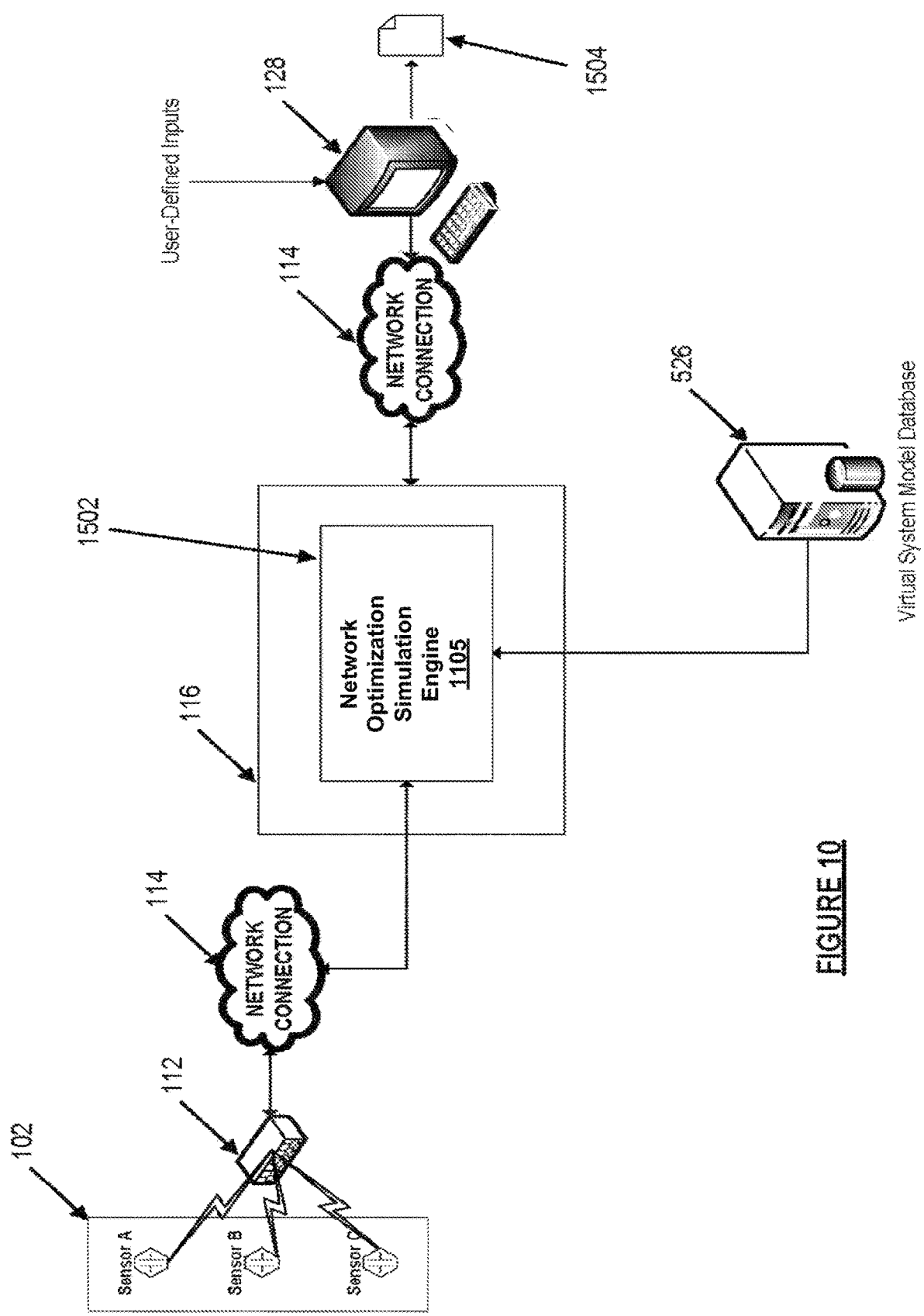
FIG. 10 is a diagram illustrating how a network optimization simulation engine works in conjunction with other elements of the analytics system to make predictions about various scenarios related to distributed energy solutions.

FIG. 10 is a diagram illustrating how a network optimization simulation engine 1005 for optimizing energy consumption in a multi-energy source site can work in conjunction with other elements of the analytics system in order to make predictions about the cost and availability of various distributed energy resources. The system illustrated in FIG. 10 is similar to the configured illustrated in FIG. 1, except that network optimization simulation engine 1005 is implemented on the analytics server 116.

The network optimization simulation engine 1105 can be configured to allow an operator to run simulations to determine how the selection of various distributed energy sources can be used to optimize the performance of the microgrid being monitored. For example, the operator can define one or more scenarios to be tested, such as changing the operating parameters of one or more of the distributed energy sources, adding or removing distributed energy generations sources, taking portions of existing energy generation sources offline, or changing the mix of energy obtained from distributed energy sources of the microgrid and energy from the macrogrid can be changed to forecast how those changes could impact the reliability of the electrical network, capacity of the microgrid, and the cost of operation.

According to an embodiment, the network optimization simulation engine 1105 can allow the operator to select an option to test multiple scenarios in parallel. Multiple copies of the virtual model of the microgrid system can be generated and each scenario tested on a copy of the virtual model. Predicted data from each scenario can then be presented to the operator on a display of the client 128. The predicted data can include predicted utilization, capacity, and reliability information for each scenario. The predicted data can also include predicted operating costs for each scenario based on the cost of generating power using the microgrid system, the cost of purchasing power from the macrogrid, and any cost offsets that might available due to the sale of electricity generated by excess capacity of the microgrid. The operator can review the information presented and determine whether to change the operating parameters of the components of the microgrid in response to the predicted data.

Figure 11:
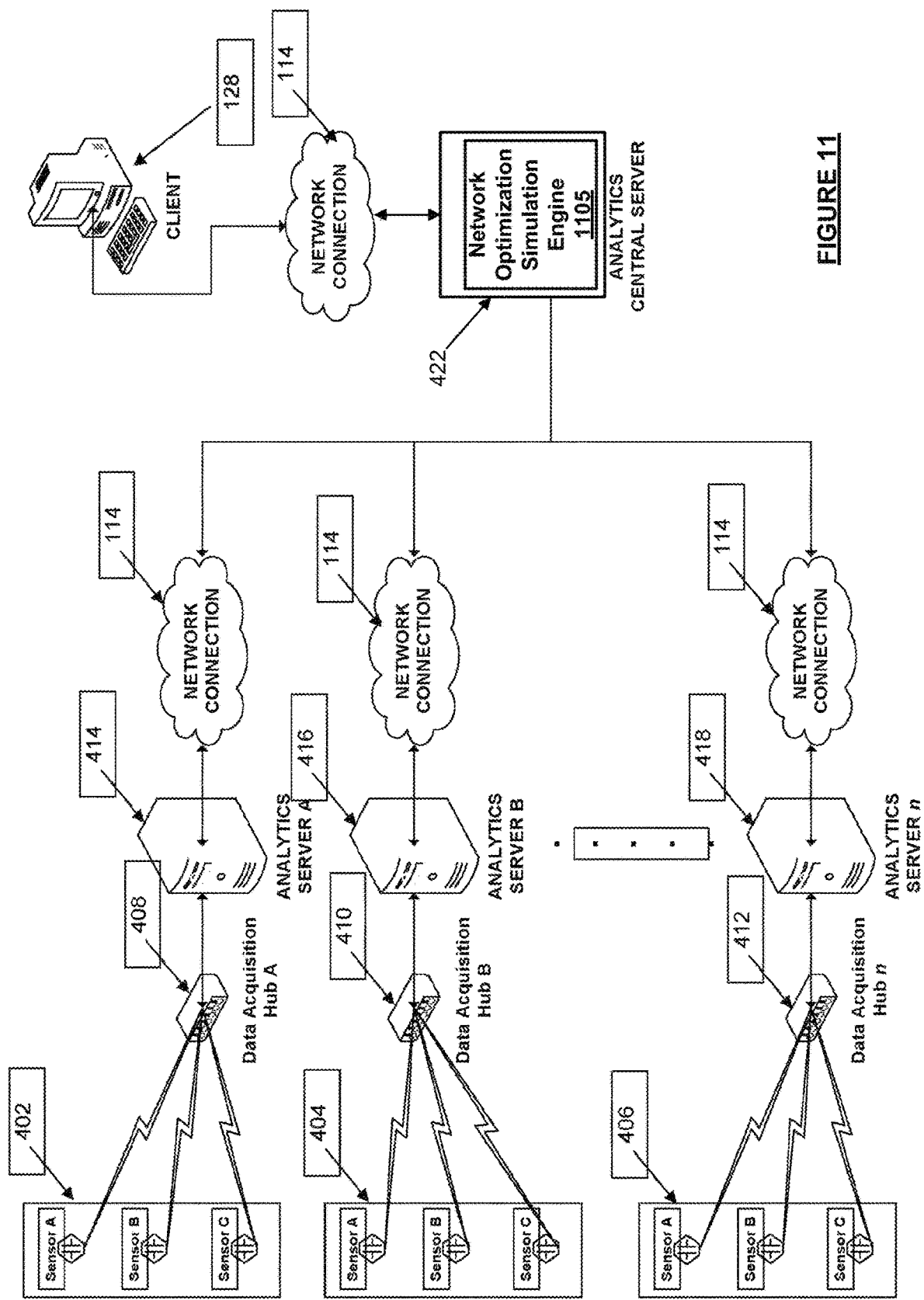
FIG. 11 is another diagram illustrating how a network optimization simulation engine works in conjunction with other elements of the analytics system to make predictions about various scenarios related to distributed energy solutions in an electric.

FIG. 11 is another diagram illustrating how a network optimization simulation engine 1105 works in conjunction with other elements of the analytics system in order to make predictions about the cost and availability of various distributed energy resources. While the embodiment illustrated in FIG. 10 is of a similar configuration as that of FIG. 4, the analytics central server 422 in the embodiment illustrated in FIG. 11 includes a market-based optimization engine 1105. As described above, a virtual model of a microgrid can be created that includes various distributed energy generation solutions. The network optimization simulation engine 1105 works similarly to that of network optimization simulation engine 1005 illustrated in FIG. 10. The network optimization simulation engine 1105 allows an operator to define one or more scenarios to generate predicted data for those scenarios. The network optimization simulation engine 1105 can create multiple copies of the virtual model of the electrical system in order to execute the simulations.

The embodiment illustrated in FIG. 11 illustrates a configuration that is similar to the electrical network configuration illustrated in FIG. 4 where multiple electrical systems are monitored. The network optimization simulation engine 1105 can be implemented on the analytics central server 422, and the monitored systems can comprise microgrid systems. According to some embodiments, the microgrid systems can be located at different geographic locations. For example, a state university system can use microgrid systems on multiple campuses. Sensors coupled to components of each microgrid system can provide real-time data regarding the operational characteristics of each of the microgrids.

The central analytics server 422 can be configured to enable a client 128 to modify and adjust the operational parameters of any the analytics servers communicatively connected to the central analytics server 422 based on the data collected from the monitored systems. Additionally, each of the analytics servers can be configured to allow a client 128 to modify the virtual system model through a virtual system model development interface using well-known modeling tools.

Figure 12:
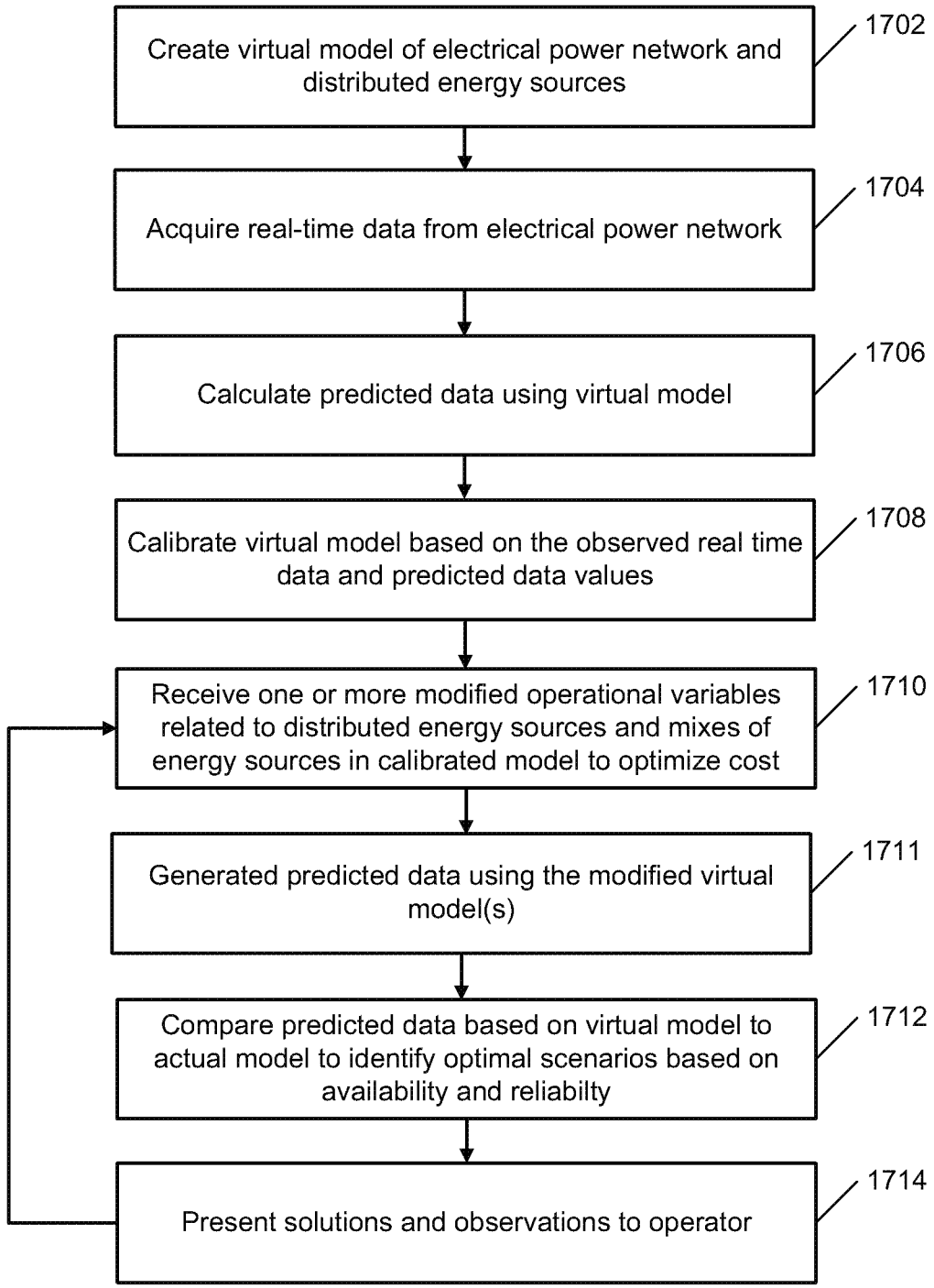
FIG. 12 is a flow chart illustrating an example process for predicting, in real-time, various aspects associated with distributed energy solutions, in accordance with one embodiment.

FIG. 12 is a flow chart illustrating an example process for operating a real-time simulation for market-based electric power system optimization according to an embodiment.

According to an embodiment, the analytics server 116 or the analytic servers 414, 416, and 418, or central analytics server 422 illustrated in FIGS. 1, 4, 10, and 11.

A virtual system model of a microgrid can be created that includes logical models of the components of the microgrid including distributed energy generation solutions (step 1702). According to embodiment, the virtual system model can be created using virtual system modeling engine 124. The virtual system model can include components for modeling reliability, modeling voltage stability, and modeling power flow of the microgrid. According to some embodiments, a plurality of virtual system models that represent discrete parts of the electrical power system can be created. In an example, the distributed energy generation solutions included in a microgrid might include solar panels, wind turbines, other on-premise energy generation solutions, or a combination thereof. The virtual model of the microgrid can be used to generate predicted data for the microgrid, including predicted capacity and utilization. Based on predicted capacity and utilization, predictions regarding the cost of operation can also be generated using the cost of generating power at the microgrid and the cost of purchasing power from the macrogrid. These costs can be offset by the sale of electricity generated by excess capacity to the public utilities on the macrogrid.

Once the virtual model or models of the electrical system have been created, real-time data can be collected from sensors interfaced with various components of the electrical system (step 1704). As described above, the sensors can be configured to provide output values for system parameters that indicate the operational status and/or health of the monitored systems. In some embodiments, data can be collected from multiple monitored systems. Each monitored system can have a data acquisition hub that collects data from the sensor interfaced with components of that system and that sends the data across a network connection to a central analytics server.

The virtual model or models of the electrical system can be used to calculate predicted operational values for the electrical system (step 1706). For example, the virtual model can be used for modeling reliability, modeling voltage stability, and modeling power flow of the electrical system. The predicted data can be used to generate market-based pricing predictions based on the performance of the components of the electrical system. For example, if the predicted utilization exceeds the predicted capacity of the microgrid, electricity from the macrogrid may need to be purchased to meet the excess utilization. Alternatively, utilization might need to be curtailed to prevent utilization from exceeding the generation capacity of the microgrid.

The predicted data generated by the virtual system model can be compared with real-time sensor data collected from the electrical system and the virtual model can be calibrated with the real-time data to ensure that the virtual system model provide data output that is consistent with the actual real-time data (step 1708). According to an embodiment, decision engine 212 can be configured to look for significant deviations between the predicted values and the real-time values as received. According to an embodiment, if the real-time sensor data and the predicted values generated by the virtual system model diverge beyond a predetermined threshold, an alarm condition can be generated to alert a system administrator that the virtual system model is out of synch with the real-time model of the network. According to an embodiment, if the real-time sensor data and the predicted values generated by the virtual system model diverge beyond a predetermined threshold, a calibration request can be generated that is sent to the calibration engine 134, which will cause the calibration engine 134 to calibrate the virtual model. For example, the predicted capacity for a microgrid could vary from the real-time data collected from the microgrid if system changes have been made to a distributed generation resource, components of a distributed generation resource are undergoing routing maintenance, or an unplanned outage of one or more components of the distributed generation resource has occurred. Calibrating the virtual model of the electrical system to match the real-time model of the system can result in increasingly accurate prediction data being generated using the virtual model.

The calibrated virtual system model can then be used to generate predicted data for various "what if" scenarios. The network optimization simulation engine can be configured to receive one or more modified operational variables related to distributed energy sources and mixes of energy sources in calibrated model to optimize cost (step 1710). The network optimization simulation engine can update the virtual model of the electrical system being used by the simulation engine 208 using the modified parameters For example, the operating parameters of one or more of the distributed energy sources can be changed, additional distributed energy sources can be added, existing energy sources can be taken offline, or the mix of energy obtained from distributed energy sources of the microgrid and energy from the macrogrid can be changed to forecast how those changes could impact the reliability of the electrical network, capacity of the microgrid, and the cost of operation. The cost of operation can include the cost of generating electricity using the microgrid and the cost of purchasing electricity from the macrogrid. These costs can be offset by the sale of electricity generated by the microgrid based on excess capacity.

In another example, the generation capacities of some microgrid distributed energy generation solutions that can be influenced by changing weather conditions, such as solar power generation system and wind turbine generation systems. Various weather scenarios can be tested to determine what the effects of these conditions might be on the cost of operation and the availability and reliability of the network. If generation capacity is decreased due to weather conditions, additional power may be needed from the macrogrid. Alternatively, a particularly clear and sunny period of weather could result in a solar power generation system generate more power, but higher temperatures caused by the clear weather could result in these gains could be offset by additional loads on the system due to increased air conditioning system operations. The virtual model allows the operator to test complex scenarios such as these to determine what the impact of these scenarios might be.

According to another embodiment, the what-if scenarios can be used for disaster or emergency preparedness simulations. The operator can define various scenarios where one or more distributed energy sources have been damaged or rendered unavailable. Various scenarios can be tested to predict the effects on capacity and utilization might be for these scenarios. An administrator can utilize the predictions to prepare contingency plans for dealing with these scenarios.

In other words, the virtual model can be used to allow an administrator to make hypothetical changes to the operating parameters of one or more distributed energy sources and test the resulting effect, without taking down any of the facilities or having to perform costly and time consuming analysis. According to some embodiments, multiple copies of the virtual model can be created and a different scenario can be modeled using a copy of the virtual model. The predicted data generated using the virtual model or models can be used estimate price and availability of electricity based on the various changes the made by the administrator.

The simulation engine 208 can then generate predicted data for each of the modified virtual model or models using the parameters provided in step 1710 (step 1711). According to some embodiments, the original virtual model of the electrical system is not modified when performing "what-if" analysis for various scenarios. Instead, one or more copies of the virtual model are created to test each of the scenarios.

The predicted data generated by each of the scenarios being tested can then be compared to real-time data associated with the real-time model of the electrical system to identify optimal scenarios (step 1712). The comparison of the predicted data to the actual real-time data can be used to identify which solutions might provide the optimal pricing and availability of electrical resources. The results of these simulations as well as real-time status information can be presented to the administrator/operator (step 1714). The operator may then opt to make changes to one or more variables related to the distributed energy sources (step 1710) in order to see how these changes may further optimize cost and availability of the system. According to an embodiment, the system can provide a user interface, such as a web page or a graphical user interface that an operator can access to display a view a representation of the real-time status of the electrical system as well as predicted data for one or more virtual models of the system. The user interface may also enable the operator to select a particular model that provides optimal results and the system will update the operating parameters of the electrical system to match those of the selected virtual model.

The embodiments described herein, can be practiced with other computer system configurations including hand-held devices, microprocessor systems, microprocessor-based or programmable consumer electronics, minicomputers, mainframe computers and the like. The embodiments can also be practiced in distributing computing environments where tasks are performed by remote processing devices that are linked through a network.

It should also be understood that the embodiments described herein can employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations that form part of the embodiments described herein are useful machine operations. The embodiment also relates to a device or an apparatus for performing these operations. The systems and methods described herein can be specially constructed for the required purposes, such as the carrier network discussed above, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The embodiments described herein can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Certain embodiments can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

The invention claimed is:

1. A system for optimizing operation of an electric power system, comprising:
    a data acquisition component configured to acquire real-time output data from sensors interfaced with components of the electric power system;
    an analytics server communicatively connected to the data acquisition component, comprising:
        a virtual system modeling engine configured to generate simulated output data for the electric power system utilizing a first virtual system model of the electric power system;
        an analytics engine configured to monitor the real-time output data and the simulated output data of the electric power system, and update the first virtual system model based on a difference between the real-time output data and the simulated output data; and
        a network optimization simulation engine configured to receive a multiplicity of modified operational variables related to distributed energy sources and mixes of energy sources in the first virtual system model, create a multiplicity of modified virtual system models based on the multiplicity of modified operational variables, generate predicted data based on the multiplicity of modified virtual system models, compare the predicted data to the real-time output data of the first virtual system model, and identify an optimal scenario regarding operational costs, reliability and availability of the distributed energy sources and the mixes of energy sources based on the comparison,
    wherein the network optimization simulation engine changes a mix of energy obtained from a microgrid energy source and a macrogrid energy source to identify the optimal scenario.

2. The system of claim 1, wherein the analytics engine is further configured to initiate a calibration and synchronization operation to update the first virtual system model when a difference between the real-time output data and the simulated output data exceeds a threshold.

3. The system of claim 2, wherein the threshold is a Defined Difference Tolerance (DDT) value for at least one of a frequency deviation, a voltage deviation, a power factor deviation, and other deviations between the real-time output data and simulated output data.

4. The system of claim 1, wherein the multiplicity of modified operational variables comprises at least one operating parameter of the distributed energy sources and the mixes of energy sources being used to generate power for the electric power system.

5. The system of claim 1, wherein the multiplicity of modified operational variables comprises at least one electricity output of the distributed energy sources and the mixes of energy sources being used to generate power for the electric power system.

6. The system of claim 1, further comprising a client terminal configured to allow a system administrator to modify the operational variables of the first virtual system model when the network optimization simulation engine is operating in a scenario builder mode and display a report of the optimal scenario.

7. The system of claim 6, wherein the optimal scenario is communicated by way of graphics on a display interfaced with the client terminal.

8. The system of claim 6, wherein the optimal scenario is communicated by way of text on a display interfaced with the client terminal.

9. The system of claim 6, wherein the optimal scenario is communicated by way of synthesized speech generated by the client terminal.

10. A system for optimizing operation of an electric power system, comprising:
a data acquisition component configured to acquire real-time output data from sensors interfaced with components of the electric power system;
an analytics server communicatively connected to the data acquisition component, comprising: a virtual system modeling engine configured to generate simulated output data for the electric power system utilizing a first virtual system model of the electric power system;
an analytics engine configured to initiating a calibration and synchronization operation, and update the first virtual system model based on a difference between the real-time output data and the simulated output data; and
a network optimization simulation engine configured to receive a multiplicity of modified operational variables related to distributed energy sources and mixes of energy sources in the first virtual system model, create a multiplicity of modified virtual system models based on the multiplicity of modified operational variables, generate predicted data based on the multiplicity of modified virtual system models, compare the predicted data to the real-time output data of the first virtual system model, and identify an optimal scenario regarding operational costs, reliability and availability of the distributed energy sources and the mixes of energy sources based on the comparison,
wherein the network optimization simulation engine changes a mix of energy obtained from a microgrid energy source and a macrogrid energy source to identify the optimal scenario.

11. The system of claim 10, further comprising a client terminal configured to transmit the multiplicity of modified operational variables to the analytics server.

12. A method for optimizing operation of an electric power system, comprising:
providing a data acquisition component communicatively connected to an analytics server, wherein the analytics server comprises a virtual system modeling engine, an analytics engine, and a network optimization simulation engine;
the data acquisition component acquiring real-time output data from sensors interfaced with components of the electric power system;
the virtual system modeling engine generating simulated output data for the electric power system utilizing a first virtual system model of the electric power system;
the analytics engine monitoring the real-time output data and the simulated output data of the electric power system;
the analytics engine initiating a calibration and synchronization operation to update the first virtual system model when a difference between the real-time output data and the simulated output data exceeds a threshold; and
the network optimization simulation engine receiving a multiplicity of modified operational variables related to distributed energy sources and mixes of energy sources in the updated first virtual system model;
the network optimization simulation engine creating a multiplicity of modified virtual system models based on the multiplicity of modified operational variables;
the network optimization simulation engine generating predicated data based on the multiplicity of modified virtual system models;
the network optimization simulation identifying an optimal operating configuration regarding operational costs, reliability and availability of the distributed energy sources and the mixes of energy sources based on the predicted data; and
the network optimization simulation engine changing a mix of energy obtained from a microgrid energy source and a macrogrid energy source to identify the optimal operating configuration.

13. The method of claim 12, wherein the threshold is a Defined Difference Tolerance (DDT) value for at least one of the frequency deviation, voltage deviation, power factor deviation, and other deviations between the real-time output data and simulated output data.

14. The method of claim 12, wherein the predicted data comprises predicted utilization, capacity, and reliability information.

15. The method of claim 12, further comprising the network optimization simulation engine identifying an optimal operating configuration for the electric power system based on a comparison of multiple sets of predicted data generated from the multiplicity of modified virtual system models to the real-time output data of the updated first virtual system model.

16. The method of claim 15, further comprising a client terminal displaying the comparison.

17. The method of claim 16, further comprising the client terminal displaying the comparison as a set of graphics on a display interface of the client terminal.

18. The method of claim 16, further comprising the client terminal displaying the comparison as text on a display interface of the client terminal.

19. The method of claim 12, wherein the multiplicity of modified operational variables includes at least one operating parameter of the distributed energy sources and the mixes of energy sources being used to generate power for the electric power system.

20. The method of claim 12, wherein the multiplicity of modified operational variables includes at least one electricity output of the distributed energy sources and the mixes of energy sources being used to generate power for the electric power system.

* * * * *